United States Patent
Matsuda et al.

(10) Patent No.: US 11,751,417 B2
(45) Date of Patent: *Sep. 5, 2023

(54) ORGANIC DEVICE AND METHOD OF MANUFACTURING THE SAME

(71) Applicant: CANON KABUSHIKI KAISHA, Tokyo (JP)

(72) Inventors: Yojiro Matsuda, Kawasaki (JP); Masaki Kurihara, Koza-gun (JP); Daisuke Shimoyama, Yamato (JP); Hiroaki Naruse, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 60 days.

This patent is subject to a terminal disclaimer.

(21) Appl. No.: 17/238,320

(22) Filed: Apr. 23, 2021

(65) Prior Publication Data

US 2021/0265591 A1    Aug. 26, 2021

Related U.S. Application Data

(63) Continuation of application No. 16/366,435, filed on Mar. 27, 2019, now Pat. No. 11,018,316.

(30) Foreign Application Priority Data

Apr. 26, 2018   (JP) .................................. 2018-085725
Nov. 21, 2018   (JP) .................................. 2018-218489

(51) Int. Cl.
*H10K 50/842*     (2023.01)
*H10K 30/88*      (2023.01)
(Continued)

(52) U.S. Cl.
CPC ......... *H10K 50/8426* (2023.02); *H10K 30/88* (2023.02); *H10K 39/32* (2023.02);
(Continued)

(58) Field of Classification Search
CPC . H01L 51/5246; H01L 27/307; H01L 27/322; H01L 27/3244; H01L 2251/5361;
(Continued)

(56) References Cited

U.S. PATENT DOCUMENTS 9,547,252 B2   1/2017   Mizuno et al.
10,483,492 B2  11/2019  Kamiya
(Continued)

FOREIGN PATENT DOCUMENTS

CN   105679964 A   6/2016
CN   107527931 A   12/2017
(Continued)

OTHER PUBLICATIONS

Machine Translation of KR 20160094481 (Year: 2016).*
(Continued)

*Primary Examiner* — Julia Slutsker
(74) *Attorney, Agent, or Firm* — VENABLE LLP

(57) ABSTRACT

A device comprising a first layer, a sealing layer and a resin layer stacked in that order and an organic layer arranged between the first layer and the sealing layer in a pixel region is provided. The first, sealing and resin layers have openings for exposing an electrode in a peripheral region. The sealing layer includes second and third layers each having a water permeability lower than the first layer, and a fourth layer arranged between the second layer and the third layer and having a defect density lower than the second layer. A step of the second layer arranged above the end of the opening of the first layer is covered with the fourth layer and a step of the third layer arranged above the end of the opening of the first layer is covered with the resin layer.

26 Claims, 13 Drawing Sheets

(51) Int. Cl.
*H10K 39/32* (2023.01)
*H10K 59/12* (2023.01)
*H10K 59/38* (2023.01)
*H10K 71/00* (2023.01)
*H10K 102/00* (2023.01)

(52) U.S. Cl.
CPC ............. *H10K 59/12* (2023.02); *H10K 59/38* (2023.02); *H10K 71/00* (2023.02); *H10K 2102/00* (2023.02); *H10K 2102/351* (2023.02)

(58) Field of Classification Search
CPC ... H01L 51/50; Y02E 10/549; H10K 50/8426; H10K 30/88; H10K 39/32; H10K 59/12; H10K 59/38; H10K 71/00; H10K 2102/00; H10K 2102/351; H10K 50/844; H10K 59/131; H10K 50/00; H10K 50/84
See application file for complete search history.

(56) References Cited

U.S. PATENT DOCUMENTS

| | | |
|---|---|---|
| 11,054,937 B2 | 7/2021 | Kamiya |
| 2010/0248403 A1 | 9/2010 | Hatano et al. |
| 2013/0130491 A1 | 5/2013 | Osako |
| 2014/0117330 A1 | 5/2014 | Cho et al. |
| 2015/0001533 A1 | 1/2015 | Kuwabara et al. |
| 2015/0048329 A1 | 2/2015 | Kim |
| 2016/0043146 A1 | 2/2016 | Uesaka et al. |
| 2016/0064694 A1 | 3/2016 | Choi et al. |
| 2016/0154268 A1 | 6/2016 | Yamazaki et al. |
| 2017/0271421 A1 | 9/2017 | Jinbo et al. |
| 2019/0363142 A1 | 11/2019 | Tanaka et al. |
| 2020/0185644 A1 | 6/2020 | Ohta et al. |
| 2020/0227673 A1 | 7/2020 | Chang et al. |

FOREIGN PATENT DOCUMENTS

| | | | | |
|---|---|---|---|---|
| JP | 2010-198969 A | | 9/2010 | |
| KR | 10-2016-0094481 A | | 8/2016 | |
| KR | 20160094481 | * | 10/2016 | ......... H01L 27/3227 |
| WO | 2007/145711 A1 | | 12/2007 | |

OTHER PUBLICATIONS

First Office Action in Chinese Application No. 201910324802.0 (dated Dec. 2021).
Extended European Search Report in European Application No. 19164237.0 (dated Sep. 24, 2019).

* cited by examiner

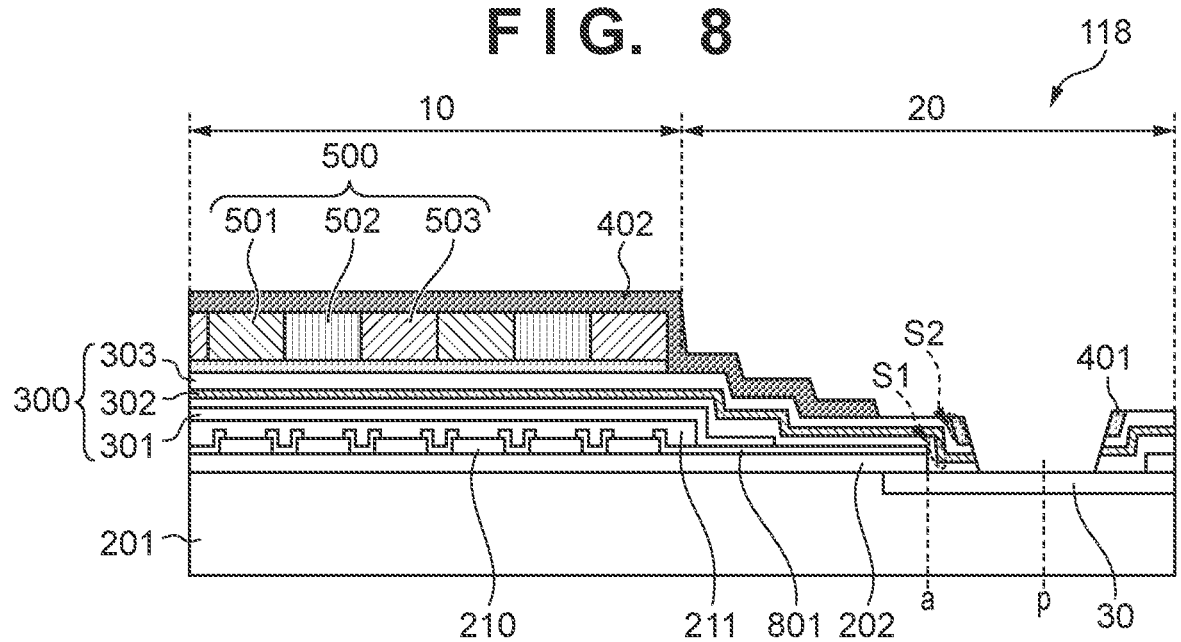

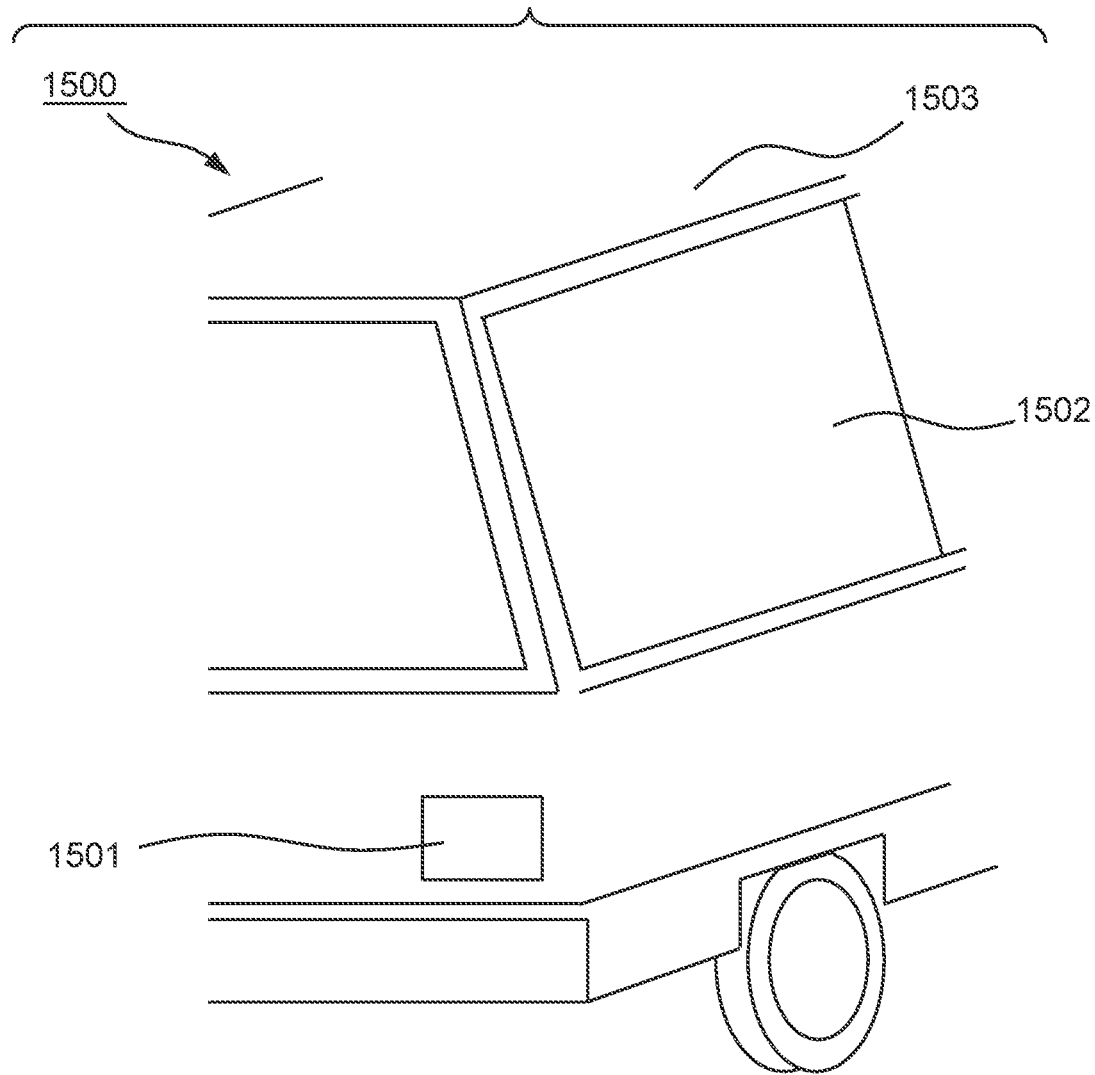

ORGANIC DEVICE AND METHOD OF MANUFACTURING THE SAME

CROSS-REFERENCE TO RELATED APPLICATIONS

This application is a continuation of U.S. patent application Ser. No. 16/366,435, filed Mar. 27, 2019, which claims the benefit of Japanese Patent Application No. 2018-085725, filed Apr. 26, 2018, and Japanese Patent Application No. 2018-218489, filed Nov. 21, 2018. All prior applications are hereby incorporated by reference herein in their entirety.

BACKGROUND OF THE INVENTION

Field of the Invention

The present invention relates to an organic device and a method of manufacturing the same.

Description of the Related Art

An organic device including an organic function layer containing an organic compound is known. Examples are a light-emitting device using an organic electroluminescence film, and an imaging device using an organic photoelectric conversion film. The organic compound easily deteriorates the characteristics due to water. Japanese Patent Laid-Open No. 2010-198969 has disclosed a technique that seals an organic function layer by using a sealing layer formed by stacking a silicon nitride film and an aluminum oxide film.

The present inventors have found that if an insulating layer using a material having water permeability higher than that of a sealing layer is arranged below the organic function layer in the whole area of a device, water from a pad electrode in an opening formed in the insulating layer and the sealing layer sometimes penetrates the organic function layer through the insulating layer. If water penetrates the organic function layer, the characteristics of an organic compound contained in the organic function layer deteriorate, and this can decrease the reliability of the organic device.

SUMMARY OF THE INVENTION

Some embodiments of the present invention provide a technique advantageous in improving the reliability of an organic device.

According to some embodiment, an organic device including, on a surface of a substrate, a pixel region in which a plurality of pixels including an organic function layer are arranged, and a peripheral region including a pad electrode, the organic device comprising a first layer, a sealing layer, and a resin layer stacked in that order from a side of the surface, wherein the organic function layer is arranged between the first layer and the sealing layer in the pixel region, and the first layer, the sealing layer, and the resin layer have openings for exposing the pad electrode in the peripheral region, the sealing layer includes, from the side of the surface, a second layer and a third layer each having a water permeability lower than that of the first layer, and a fourth layer arranged between the second layer and the third layer and having a defect density lower than that of the second layer, an end of the opening of the first layer is covered with the second layer, the fourth layer, and the third layer, a step of the second layer, which is arranged above the end of the opening of the first layer, is covered with the fourth layer, and a step of the third layer, which is arranged above the end of the opening of the first layer, is covered with the resin layer, is provided.

According to some other embodiment, an organic device including, on a surface of a substrate, a pixel region in which a plurality of pixels including an organic function layer are arranged, and a peripheral region including a pad electrode, the organic device comprising a first layer containing a compound containing at least oxygen and silicon, a sealing layer, and a resin layer stacked in that order from a side of the surface, wherein the organic function layer is arranged between the first layer and the sealing layer in the pixel region, and the first layer, the sealing layer, and the resin layer have openings for exposing the pad electrode in the peripheral region, the sealing layer includes, from the side of the surface, a second layer and a third layer each containing a compound containing at least nitrogen and silicon, and a fourth layer arranged between the second layer and the third layer and containing a compound containing at least oxygen and aluminum, an end of the opening of the first layer is covered with the second layer, the fourth layer, and the third layer, a step of the second layer, which is arranged above the end of the opening of the first layer, is covered with the fourth layer, and a step of the third layer, which is arranged above the end of the opening of the first layer, is covered with the resin layer, is provided.

According to still other embodiment, a method of manufacturing an organic device including, on a surface of a substrate, a pixel region in which a plurality of pixels including an organic function layer are arranged, and a peripheral region including a pad electrode, comprising: forming a first layer above the surface of the substrate on which the pad electrode is arranged; etching the first layer by using a mask pattern having an opening above the pad electrode, thereby exposing the pad electrode; forming a plurality of pixels above the first layer in the pixel region; stacking a sealing layer and a resin layer in that order after the forming the plurality of pixels; and exposing the pad electrode by etching the sealing layer and the resin layer by using a mask pattern having an opening inside an end of an opening formed in the first layer in the etching, in orthographic projection to the surface, wherein the sealing layer includes, from the side of the surface, a second layer and a third layer each having a water permeability lower than that of the first layer, and a fourth layer arranged between the second layer and the third layer and having a defect density lower than that of the second layer, an end of the opening of the first layer is covered with the second layer, the fourth layer, and the third layer, in the portion where the pad electrode is exposed, a step of the second layer, which is arranged above the end of the opening of the first layer, is covered with the fourth layer, and a step of the third layer, which is arranged above the end of the opening of the first layer, is covered with the resin layer, is provided.

Further features of the present invention will become apparent from the following description of exemplary embodiments (with reference to the attached drawings).

BRIEF DESCRIPTION OF THE DRAWINGS

FIG. 8 is a sectional view of the organic device shown in FIG. 1;

FIG. 14 is a view showing an example of an automobile using the organic device shown in FIG. 1.

DESCRIPTION OF THE EMBODIMENTS

Figure 1:
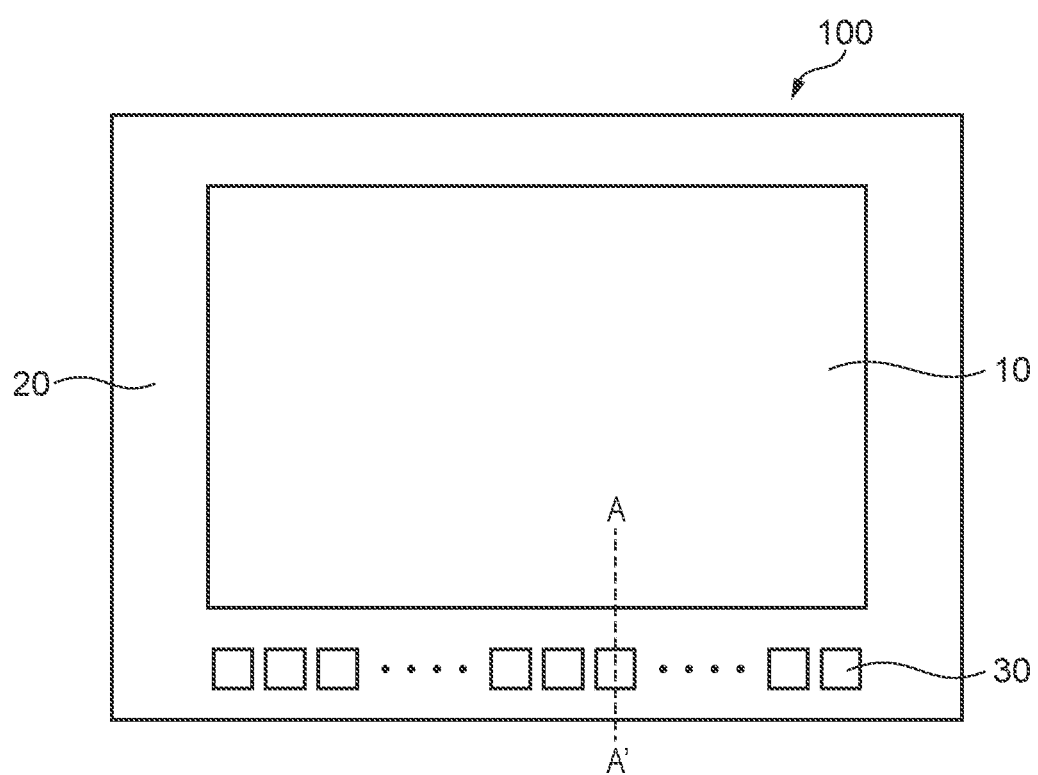
FIG. 1 is a plan view of an organic device according to an embodiment of the present invention.

Practical embodiments of an organic device according to the present invention will be explained below with reference to the accompanying drawings. Note that in the following explanation and drawings, the same reference numerals denote the same components throughout the plurality of drawings. Therefore, the same components will be explained by mutually referring to the plurality of drawings, and an explanation of the components denoted by the same reference numerals will be omitted as needed.

Figure 2A:
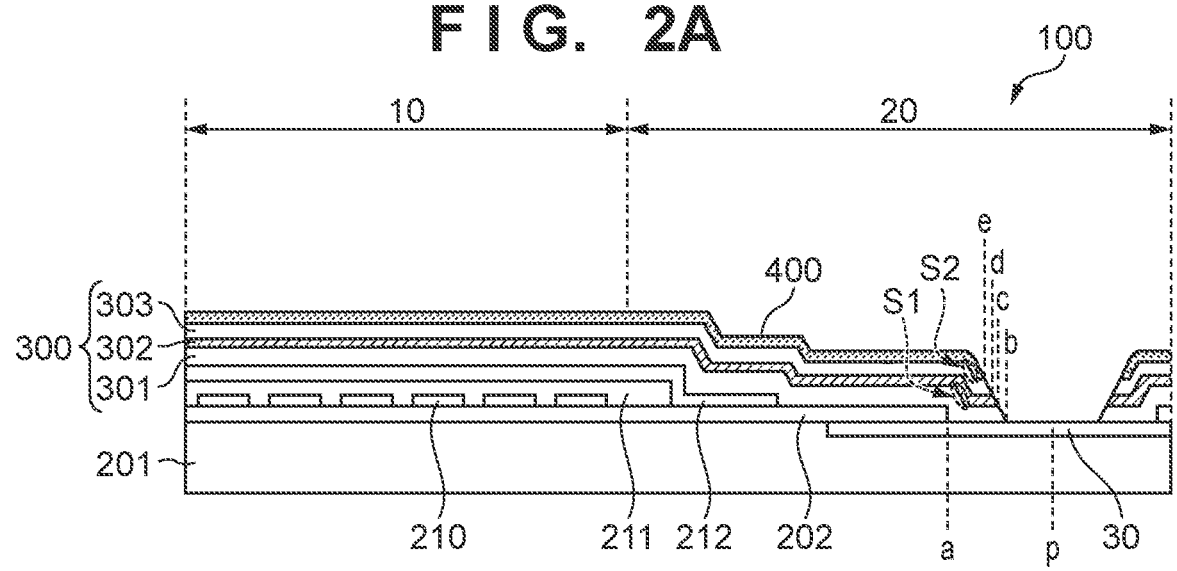
FIGS. 2A to 2C are a sectional view of the organic device shown in FIG. 1, and a sectional view and a plan view of a pad electrode and its vicinity.
Figure 2B:
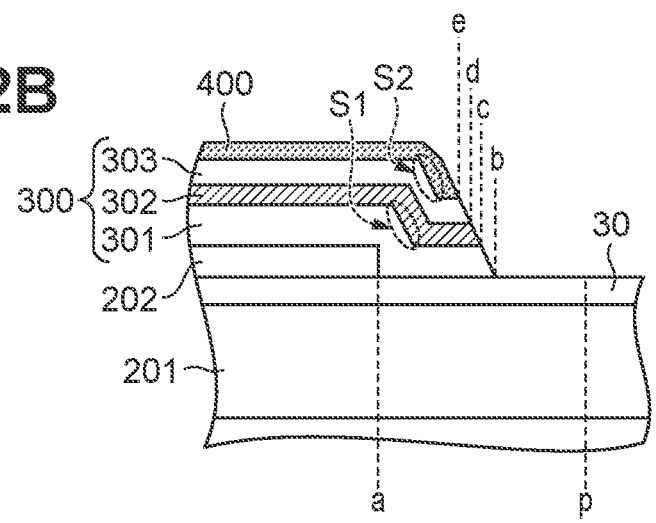
Figure 2C:
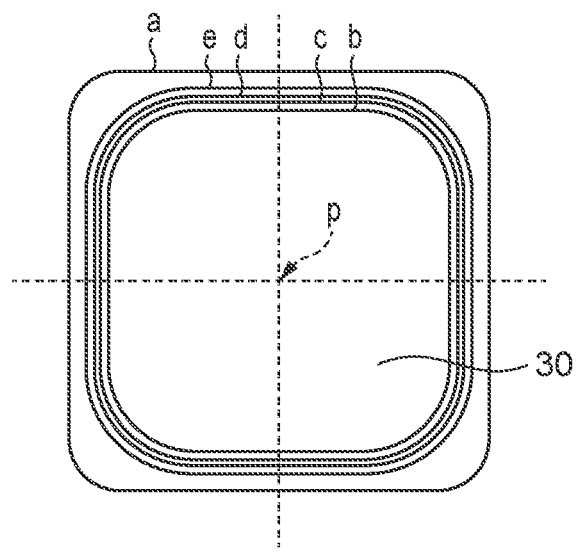

The structures of the organic devices according to the embodiments of the present invention and methods of manufacturing the same will be explained with reference to FIGS. 1 to 14. FIG. 1 is a plan view showing the structure of an organic device 100 according to the present invention. FIG. 2A is a sectional view of the organic device 100 taken along a line A-A' in FIG. 1. FIGS. 2B and 2C are a sectional view and a plan view of a pad electrode 30 and its vicinity of the organic device 100.

As shown in FIG. 1, the organic device 100 includes a pixel region 10 in which a plurality of pixels are arranged, and a peripheral region 20 including pad electrodes 30. Each pixel arranged in the pixel region 10 includes an organic function layer 211 using an organic light-emitting material or an organic photoelectric conversion material, so the organic device 100 can function as a light-emitting apparatus including light-emitting elements or an imaging apparatus including photoelectric conversion elements. The peripheral region 20 can be so arranged as to surround the pixel region as shown in FIG. 1, and can also be arranged along one or more sides of the pixel region 10. Circuits for controlling the pixel region 10 and the like can be arranged in the peripheral region 20. The pad electrodes 30 arranged in the peripheral region 20 are used to exchange signals and the like between the organic device 100 and the outside of the organic device 100. For example, the pad electrodes 30 can be used to output signals generated in the organic device 100 to the outside, and can also be used to input signals for controlling the organic device 100 from outside the organic device 100. For example, the pad electrodes 30 can further be used to supply electric power for driving the organic device 100.

As shown in FIG. 2A, the organic device 100 is obtained by stacking an insulating layer 202 (a first layer), a sealing layer 300, and a resin layer 400 in that order from the surface of a substrate 201. In the pixel region 10, lower electrodes 210, the organic function layer 211, and an upper electrode 212 are arranged between the insulating layer 202 and the sealing layer 300. In the peripheral region 20, the insulating layer 202, the sealing layer 300, and the resin layer 400 include openings for exposing the pad electrodes 30. In this specification, the surface of the substrate 201 on which the insulating layer 202, the sealing layer 300, the resin layer 400, and the like are arranged will be called an upper surface.

The insulating layer 202 is formed by using an insulating material. The insulating layer 202 can contain a compound containing at least oxygen and silicon, for example, an inorganic material such as a silicon-oxide-based material. The insulating layer 202 may also be formed by using an organic material such as a thermosetting reins or a thermoplastic resin. In this embodiment, the insulating layer 202 is formed by using silicon oxide ($SiO_x$). For example, the insulating layer 202 can be formed by a chemical vapor deposition method (CVD method) using tetraethoxysilane (TEOS). The insulating layer 202 is required to have a high coverage, and TEOS makes it possible to obtain silicon oxide having a high coverage by a surface reaction via an ethoxy group. Also, when compared to a case in which the insulating layer 202 is formed by using monosilane ($SiH_4$) gas having pyrophoricity, TEOS having no pyrophoricity can be handled safely. To ensure insulation and planarity, the thickness of the insulating layer 202 can be not less than 0.5 μm and not more than 5.0 μm.

As the substrate 201, it is possible to use an insulating substrate such as glass or a resin, a conductive substrate such as aluminum or stainless steel, or a semiconductor substrate such as silicon. Electronic circuits (not shown) such as transistors and wiring patterns are arranged between the substrate 201 and the insulating layer 202.

The lower electrodes 210 are arranged on the insulating layer 202 in the pixel region 10. The lower electrodes 210 are connected to the electronic circuits arranged between the substrate 201 and the insulating layer 202 by plug electrodes (not shown) formed by a conductive material such as tungsten. The lower electrodes 210 may also be a highly conductive metal material. The lower electrodes 210 can be formed by using a metal material such as aluminum, silver, an aluminum alloy, a silver alloy, titanium, or titanium nitride.

The organic function layer 211 is arranged on the lower electrodes 210. In this embodiment, the organic function layer 211 contains at least an organic light-emitting material or an organic photoelectric conversion material. The materials to be used in the organic function layer 211 will be described later.

The upper electrode 212 is arranged on the organic function layer 211. If the organic function layer 211 contains an organic light-emitting material, the upper electrode 212 is an electrode for emitting light generated by the organic function layer 211. If the organic function layer 211 contains an organic photoelectric conversion material, the upper electrode 212 is an electrode for transmitting light to enter the organic function layer 211. To use a large amount of light, a material having a high light transmittance is used as the organic function layer 211. As the upper electrode 212, it is possible to use a transparent oxide conductive material such as tin oxide, indium oxide, indium tin oxide, or indium zinc oxide. A thin-film metal electrode may also be used as the upper electrode 212. In this case, it is possible to use a thin film of, for example, gold, platinum, silver, aluminum, chromium, magnesium, or an alloy of these metals. If using the thin-film metal electrode, the film thickness can be not less than 1 nm and not more than 30 nm in order to achieve both a high conductivity and the absorption and suppression of light by the metal. If using magnesium as the upper electrode 212, water penetration must be suppressed as in the organic function layer 211, because magnesium easily reacts with water.

The sealing layer 300 is arranged on the upper electrode 212. In this embodiment, from the upper surface side of the substrate 201, the sealing layer 300 includes water inhibiting layers 301 (a second layer) and 303 (a third layer) having water permeability lower than that of the insulating layer 202. The sealing layer 300 further includes a defect preventing layer 302 (a fourth layer) arranged between the water inhibiting layers 301 and 303, and having defect density lower than that of the water inhibiting layer 301. In this embodiment, the sealing layer 300 has a stack structure including the water inhibiting layers 301 and 303 having a low water permeability and the defect preventing layer 302 having an extremely high coverage and a low defect density, and hence can suppress the influence of water in the external atmosphere on the organic function layer 211.

The water inhibiting layers 301 and 303 can contain a compound containing at least nitrogen and silicon, more specifically, can contain a silicon-nitride-based material. For example, the water inhibiting layers 301 and 303 may also be silicon nitride (SiN) or silicon oxynitride (SiON) formed by using the CVD method. The water inhibiting layers 301 and 303 using silicon nitride or silicon oxynitride formed by the CVD method have an extremely low water permeability of about $1 \times 10^{-6}$ g/cm$^2 \cdot$day. The material of the water inhibiting layers 301 and 303 is not limited to silicon nitride or silicon oxynitride, and can be any material as long as these layers are formed to have a high light transmittance as in the upper electrode 212 and water permeability lower than that of the insulating layer 202. For example, the water inhibiting layers 301 and 303 can be formed to have a water permeability of $1 \times 10^{-5}$ g/m$^2 \cdot$day or less. The water inhibiting layers 301 and 303 can be layers made of the same material such as silicon nitride, and can also be layers made of different materials such as silicon nitride and silicon oxynitride. Furthermore, the film thicknesses of the water inhibiting layers 301 and 303 can be either the same or different.

The defect preventing layer 302 can contain a compound containing at least oxygen and aluminum, more specifically, can contain an aluminum-oxide-based material. For example, the defect preventing layer 302 can be aluminum oxide formed by using an atomic layer deposition method (ALD method). The substrate 201 on which the water inhibiting layer 301 is formed is placed in a deposition chamber in a vacuum state, and trimethyl aluminum (TMA) gas is supplied, thereby adsorbing a monoatomic layer of TMA to the surface of the water inhibiting layer 301. After that, the TMA gas is exhausted from the deposition chamber. Then, oxygen is supplied, and plasma is generated by inputting high-frequency electric power, thereby oxidizing TMA adsorbed on the surface of the water inhibiting layer 301. Subsequently, O$_2$ in the deposition chamber is exhausted. Consequently, a monoatomic layer of aluminum oxide is formed on the surface of the water inhibiting layer 301. The defect preventing layer 302 using aluminum oxide having a desired film thickness can be formed by repeating this process.

The defect preventing layer 302 formed by the ALD method has high film deposition properties in an uneven portion and also has an extremely high coverage, and hence has the feature that the defect density in the film is lower than that of a thin film deposited by a sputtering method or the CVD method. The ALD method has a long deposition time. Therefore, to shorten the tact time for depositing the defect preventing layer 302, the film thickness of the defect preventing layer 302 can be several tens to hundreds of nm. For example, the film thickness of the defect preventing layer 302 can be not less than 10 nm and not more than 500 nm, and can also be not less than 50 nm and not more than 100 nm. In this embodiment, aluminum oxide formed by using the ALD method is used as the defect preventing layer 302. However, it is also possible to use titanium oxide, zirconium oxide, or the like. Also, the formation method is not limited to the ALD method, and it is only necessary to be able to form the defect preventing layer 302 having high film deposition properties in an uneven portion and a high coverage.

As the resin layer 400, a thermosetting resin, a thermoplastic resin, or the like can be used. As the resin layer 400, it is possible to use, for example, a phenol resin, an epoxy resin, a polyimide resin, a polyethylene resin, a polystyrene resin, an acrylic resin, a fluorine resin, or a material mixture of these resins. In addition, a surface treatment for improving the water repellency of the surface of the resin layer 400 may also be performed. For example, it is possible to roughen the surface of the resin layer 400 by etching the surface, or form a fluorine coat on the surface of the resin layer 400 by performing plasma processing using a fluorine-based gas on the surface.

Next, the structure around the pad electrode 30 arranged in the peripheral region 20 in this embodiment will be explained in detail below. FIG. 2B is a sectional view of the pad electrode 30 and its vicinity, and FIG. 2C is a plan view of the pad electrode 30 and its vicinity. In the peripheral region 20, the insulating layer 202, the sealing layer 300, and the resin layer 400 have openings for exposing the pad electrode 30. As a consequence, the pad electrode 30 is exposed. A flexible cable for connecting the organic device 100 and the outside of the organic device 100 is connected to the exposed pad electrode 30 by using an anisotropic conductive film (ACF) or the like. In the structure shown in FIG. 2C, the exposed portion of the pad electrode 30 is a square. However, the exposed portion is not limited to a square, and may also be any arbitrary shape such as a rectangle, a trapezoid, or a circle. A material for forming the pad electrode 30 may also be a highly conductive metal material. For example, it is possible to use metal materials such as aluminum, copper, silver, molybdenum, titanium, titanium nitride.

In this embodiment, as shown in FIGS. 2A to 2C, an end a of the opening of the insulating layer 202 is covered with the water inhibiting layer 301, the defect preventing layer 302, and the water inhibiting layer 303. Furthermore, a step S1 of the water inhibiting layer 301 caused by the end a of the opening of the insulating layer 202 is covered with the defect preventing layer 302, and a step S2 of the water inhibiting layer 303 caused by the end a of the opening of the insulating layer 202 is covered with the resin layer 400.

In this embodiment, the water inhibiting layer 301 is so formed as to cover the end a of the opening of the insulating layer 202. The insulating layer 202 using silicon oxide and having a high water permeability is not exposed around the pad electrode 30, but covered with the water inhibiting layer 301 using a silicon-nitride-based material having a low water permeability. For example, the water permeability of silicon oxide used in the insulating layer 202 is one to three orders of magnitude higher than that of the silicon-nitride-based material used in the water inhibiting layer 301. This makes it possible to prevent water from penetrating the organic function layer 211 through the insulating layer 202.

As described above, the insulating layer 202 has a thickness of about 0.5 to 5.0 μm. The water inhibiting layer 301 formed on the insulating layer 202 has the step S1 due to this thickness of the insulating layer 202. When forming silicon nitride or silicon oxynitride to be used in the water inhibiting layer 301 by the CVD method, the growth direction and the growth rate change on the upper portion, side surfaces, and bottom portion of an uneven portion such as the step S1, so the film density decrease and the denseness is lost in the step S1 in some cases. Also, an air gap is sometimes formed in a portion where those portions of silicon nitride or silicon oxynitride, which have grown in different directions, collide against each other, thereby forming a gap in the water inhibiting layer 301. Thus, the step S1 of the water inhibiting layer 301 can have fragility that increases the defect density. If water enters from a defect in the step S1 of the water inhibiting layer 301 as described above, the water sometimes enters the insulating layer 202 and penetrates the organic function layer 211 through the insulating layer 202. In the organic device 100 of this embodiment, the defect preventing layer 302 is so arranged as to cover the step S1 of the water inhibiting layer 301. Aluminum oxide formed by the ALD method and used in the defect preventing layer 302 has high film deposition properties and a high coverage in an uneven portion, and hence hardly causes a defect such as that in the step S1 of the water inhibiting layer 301. The coverage of the defect preventing layer 302 will briefly be explained. As an example, the film thickness of that portion of the defect preventing layer 302, which covers the side surface of the step S1 of the water inhibiting layer 301, can be not less than 95% and not more than 105% of the film thickness of that portion of the defect preventing layer 302, which covers a relatively flat portion such as the pixel region 10. As another example, the film thickness of that portion of the defect preventing layer 302, which covers the side surface of the step S1 of the water inhibiting layer 301, can be not less than 98% and not more than 102% of the film thickness of that portion of the defect preventing layer 302, which covers a relatively flat portion such as the pixel region 10. Since the defect preventing layer 302 reliably covers the fragile portion of the step S1 of the water inhibiting layer 301 as described above, it is possible to prevent water from entering the organic function layer 211.

The water inhibiting layer 303 has the step S2 because the defect preventing layer 302 and the water inhibiting layer 303 are so formed as to cover the step S1 of the water inhibiting layer 301 caused by the end a of the opening of the insulating layer 202. Like the step S1 of the water inhibiting layer 301, the step S2 of the water inhibiting layer 303 can have fragility that increases the defect density. If water enters from a defect in the step S2 of the water inhibiting layer 303, the water may enter the defect preventing layer 302 using aluminum oxide and corrode (hydrolyze) aluminum oxide. If aluminum oxide comes in contact with a large amount of water at a high temperature, corrosion (hydrolysis) easily occurs. To suppress this corrosion, the resin layer 400 is so arranged as to cover the step S2 of the water inhibiting layer 303 in the organic device 100 of this embodiment. The water permeability of the resin layer 400 is not so low as that of a thin film formed by an inorganic material. However, when the resin layer 400 covers the fragile portion of the step S2 of the water inhibiting layer 303, it is possible to prevent the defect preventing layer 302 from coming into contact with a large amount of water.

In this embodiment, as shown in FIGS. 2A to 2C, in orthographic projection to the upper surface of the substrate 201, an end e of the opening of the resin layer 400 is arranged closer to a center p of the exposed pad electrode 30 than the end a of the opening of the insulating layer 202. Also, in orthographic projection to the upper surface of the substrate 201, an end d of the opening of the water inhibiting layer 303 is arranged in the same position as the end e of the opening of the resin layer 400, or arranged closer to the center p of the exposed pad electrode 30 than the end e of the opening of the resin layer 400. In addition, in orthographic projection to the upper surface of the substrate 201, an end c of the opening of the defect preventing layer 302 is arranged in the same position as the end d of the opening of the water inhibiting layer 303, or arranged closer to the center p of the exposed pad electrode 30 than the end d of the opening of the water inhibiting layer 303. Furthermore, in orthographic projection to the upper surface of the substrate 201, an end b of the opening of the water inhibiting layer 301 is arranged in the same position as the end c of the opening of the defect preventing layer 302, or arranged closer to the center p of the exposed pad electrode 30 than the end c of the opening of the defect preventing layer 302. This makes it possible to suppress an invasion of water from the openings for exposing the pad electrode 30 in the insulating layer 202, the sealing layer 300, and resin layer 400, and improve the reliability of the organic device 100. The center p of the exposed pad electrode 30 may also be the geometric barycenter of the exposed portion of the pad electrode 30, in orthographic projection to the upper surface of the substrate 201.

Figure 3A:
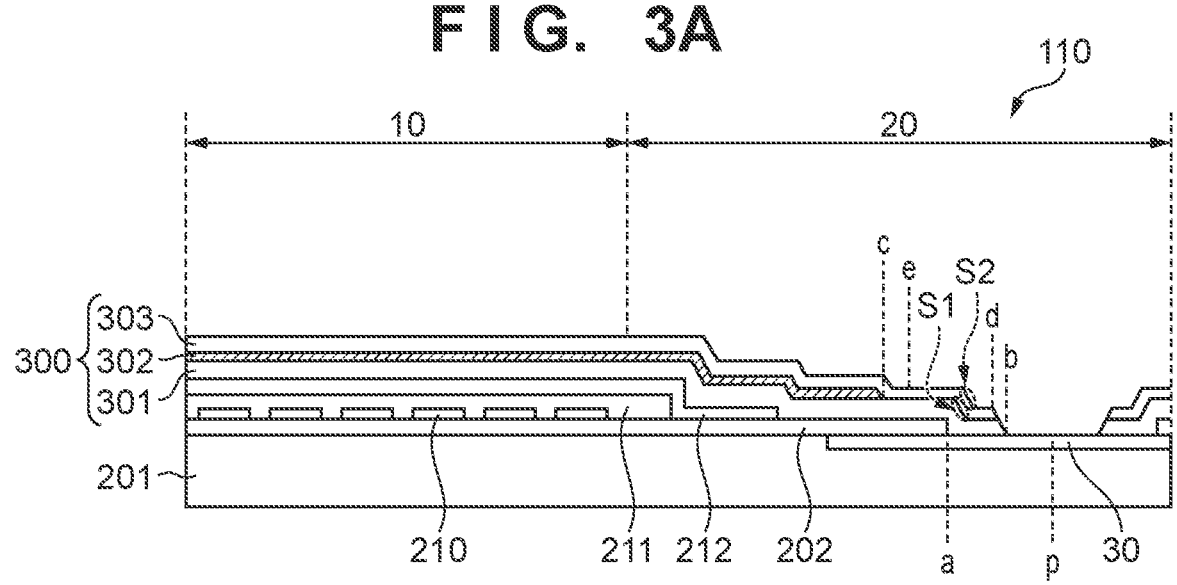
FIGS. 3A and 3B are sectional views of comparative examples of the organic device shown in FIG. 1.

FIG. 3A shows an organic device 110 of a comparative example in which the step S1 of the water inhibiting layer 301 is not covered with the defect preventing layer 302. Compared to the organic device 100 of the above-described embodiment, the end b of the opening of the water inhibiting layer 301 is arranged closer to the center p of the exposed pad electrode 30 than the end c of the opening of the defect preventing layer 302. In this case, water may enter from defects that can exist in the steps S1 and S2 of the water inhibiting layers 301 and 303, and penetrate the organic function layer 211 through the insulating layer 202. For example, characteristic deterioration of the organic device 110 is observed if the organic device 110 is left to stand under a high-temperature, high-humidity environment for a long time, or left to stand under water for a long time.

Figure 3B:
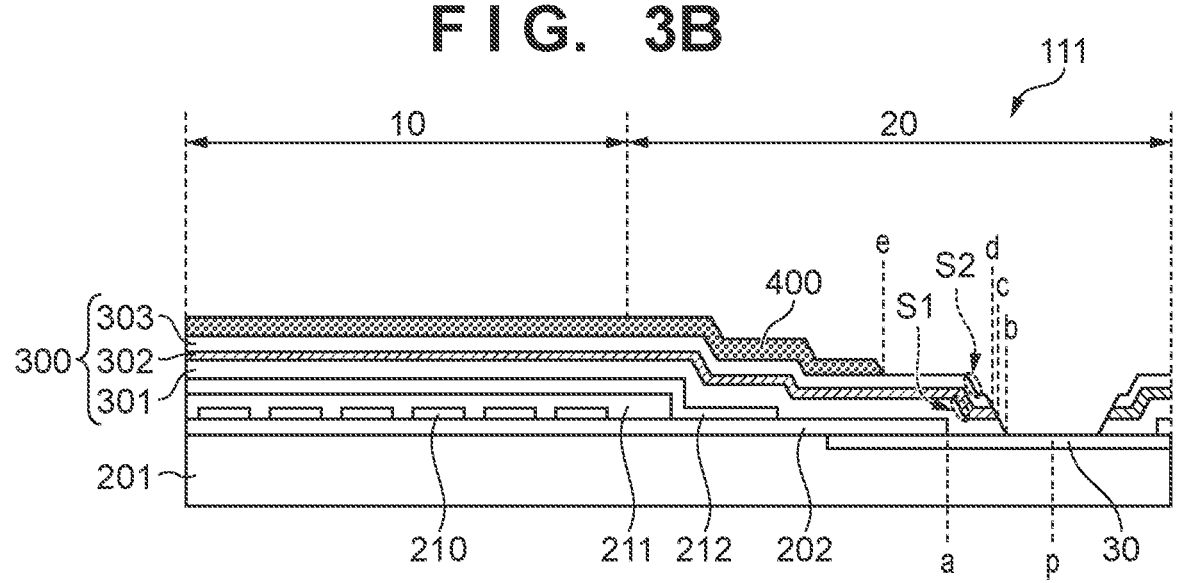

FIG. 3B shows an organic device 111 of a comparative example in which the step S2 of the water inhibiting layer 303 is not covered with the resin layer 400. Compared to the organic device 100 of the above-described embodiment, the end a of the opening of the insulating layer 202 is arranged closer to the center p of the exposed pad electrode 30 than the end e of the opening of the resin layer 400. In this case, water may enter from a defect that can exist in the step S2 of the water inhibiting layer 303, and advance the corrosion of aluminum oxide used in the defect preventing layer 302. For example, characteristic deterioration of the organic device 111 is observed if the organic device 111 is left to stand under a high-temperature, high-humidity environment for a long time, or left to stand under water for a long time.

Figure 4A:
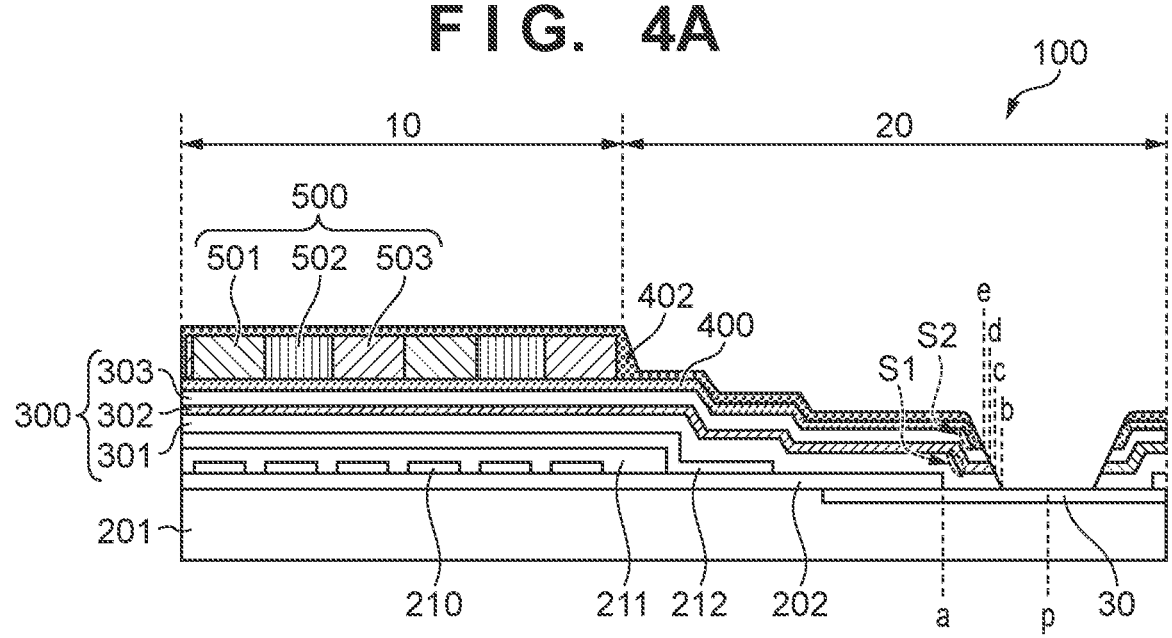
FIGS. 4A and 4B are a sectional view of the organic device shown in FIG. 1, and a sectional view of the pad electrode and its vicinity.
Figure 4B:
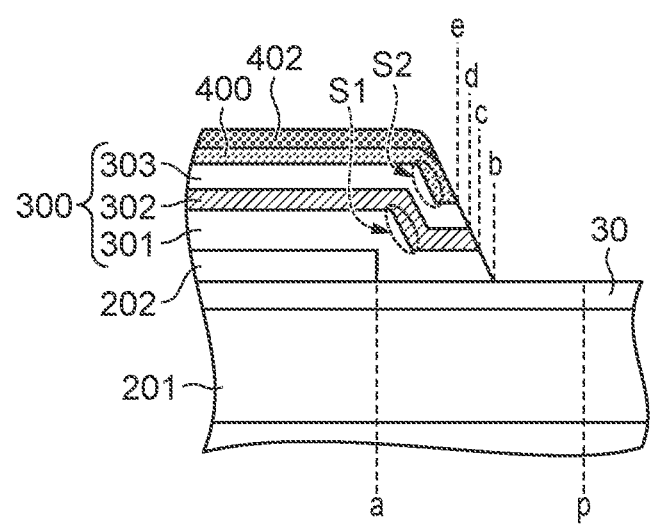

FIGS. 4A and 4B show a modification of the organic device 100 of this embodiment. As shown in FIG. 4A, the organic device 100 may also include a color filter 500 on the sealing layer 300. The color filter 500 is arranged on the resin layer 400 to be also used as an underlying planarizing layer of the color filter 500, and includes a red filter 501, a green filter 502, and a blue filter 503. A planarizing layer 402 is further arranged on the color filter 500. The process of forming the color filter 500 is performed by repeating material coating, exposure, and development for each color filter. In the arrangement shown in FIG. 4A, the resin layer 400 also functions as the color filter planarizing layer. However, it is also possible to form a planarizing layer (not shown) on the resin layer 400, and form the color filter 500 on the planarizing layer. FIG. 4B is a sectional view of the pad electrode 30 and its vicinity. The resin layer 400 that also functions as the planarizing layer below the color filter 500 is so arranged as to cover the step S2 of the water inhibiting layer 303. The resin layer 400 and the planarizing layer below the color filter 500 are not formed by different processes, but the resin layer 400 is caused to function as the planarizing layer as well. This can simplify the process and reduce the cost when manufacturing the organic device 100.

The organic function layer 211 will be explained in detail below. As described above, the organic function layer 211 according to this embodiment contains at least an organic light-emitting material or an organic photoelectric conversion material. If the organic function layer 211 contains the organic light-emitting material, the organic device 100 can function as a light-emitting device. On the other hand, if the organic function layer 211 contains the organic photoelectric conversion material, the organic device 100 can function as an imaging device.

A well-known organic light-emitting material can be used as the organic light-emitting material. It is possible to use a light-emitting material that singly functions as a light-emitting layer, or use a mixed layer of a light-emitting layer host material and a light-emitting material. Examples of the organic light-emitting material are condensed-ring compounds (for example, a fluorene derivative, a naphthalene derivative, a pyrene derivative, a perylene derivative, a tetracene derivative, an anthracene derivative, and rubrene), a quinacridone derivative, a coumarin derivative, a stilbene derivative, an organic aluminum complex such as tris(8-quinolinolato)aluminum, an iridium complex, a platinum complex, a rhenium complex, a copper complex, a europium complex, a ruthenium complex, and polymer derivatives such as a poly(phenylenevinylene) derivative, a poly(fluorene) derivative, and a poly(phenylene) derivative.

Examples of the light-emitting layer host material are an aromatic hydrocarbon compound or its derivative, a carbazole derivative, a dibenzofuran derivative, a dibenzothiophene derivative, an organic aluminum complex such as tris(8-quinolinolato)aluminum, and an organic beryllium complex.

As the organic photoelectric conversion material, it is possible to use a well-known organic material or organic-inorganic hybrid material. Examples of the organic photoelectric conversion material are a fullerene-based material, a phthalocyanine-based material, a metal-complex-based material, a squarylium-based material, an amine-based material, an indan-based material, and a fluorene-based material. The organic function layer 211 can be made of one or a plurality of these organic photoelectric conversion materials. The organic function layer 211 can also have a structure obtained by stacking layers using these materials. As the organic-inorganic hybrid material, a material for forming an organic-inorganic hybrid perovskite film can be used. This material forming the organic-inorganic hybrid perovskite film can be represented by a general formula $ABX_3$. In this general formula, A and B are cation materials, and X is an anion material. In the organic-inorganic hybrid material, one of A, B, and X is an organic material. An example is $CH_3NH_3PbI_3$ in which A=$CH_3NH_3$, B=Pb, and X=I.

An additional function layer can be arranged between the organic function layer 211 and the lower electrodes 210, or between the organic function layer 211 and the upper electrode 212. Examples of the additional function layer are a charge transporting layer and a charge blocking layer. An example of the material of the charge transporting layer is a material having a high hole mobility or electron mobility. As the material of a hole blocking layer of the charge blocking layer, it is possible to use a material having a deep HOMO (Highest Occupied Molecular Orbital) (energetically far from the vacuum level). On the other hand, as the material of an electron blocking layer of the charge blocking layer, it is possible to use a material having a shallow LUMO (Lowest Unoccupied Molecular Orbital) (close to the vacuum level). The HOMO and the LUMO can also be expressed as high and low based on the magnitude of an absolute value. More specifically, "the HOMO is deep" may also be expressed as "the HOMO is high". This similarly applies to the LUMO.

A charge injection layer can be formed on the interface between the lower electrodes 210 and the additional function layer, or on the interface between the upper electrode 212 and the additional function layer. As an electron injection layer of the charge injection layer, it is possible to use a thin film (for example, 0.5 to 1 nm) of an alkaline (earth) metal or an alkaline (earth) metal compound. Examples of the electron injection layer are lithium fluoride (LiF), potassium fluoride (KF), and magnesium oxide (MgO). As the electron injection layer of the charge injection layer, it is also possible to use a layer obtained by mixing a metal or metal compound that functions as a donor (electron-donating) dopant in an organic compound. To improve the electron injection efficiency, a metal having a low work function or a compound of the metal can be used as a dopant. As the metal having a low work function, it is possible to use an alkaline metal, an alkaline earth metal, or a rare-earth metal. An alkaline metal compound that can be handled relatively easily in the atmosphere may also be used as the electron injection layer. For example, the alkaline metal compound can be a cesium compound, and cesium carbonate is stable in the atmosphere and easy to handle. The organic compound of the electron injection layer can also be an electron transporting material, and it is possible to use a well-known material, for example, an aluminum quinolinol complex or a phenanthroline compound. Since the alkaline metal easily reacts with water, it is necessary to suppress an invasion of water in the same manner as in the organic function layer 211.

Figure 9:
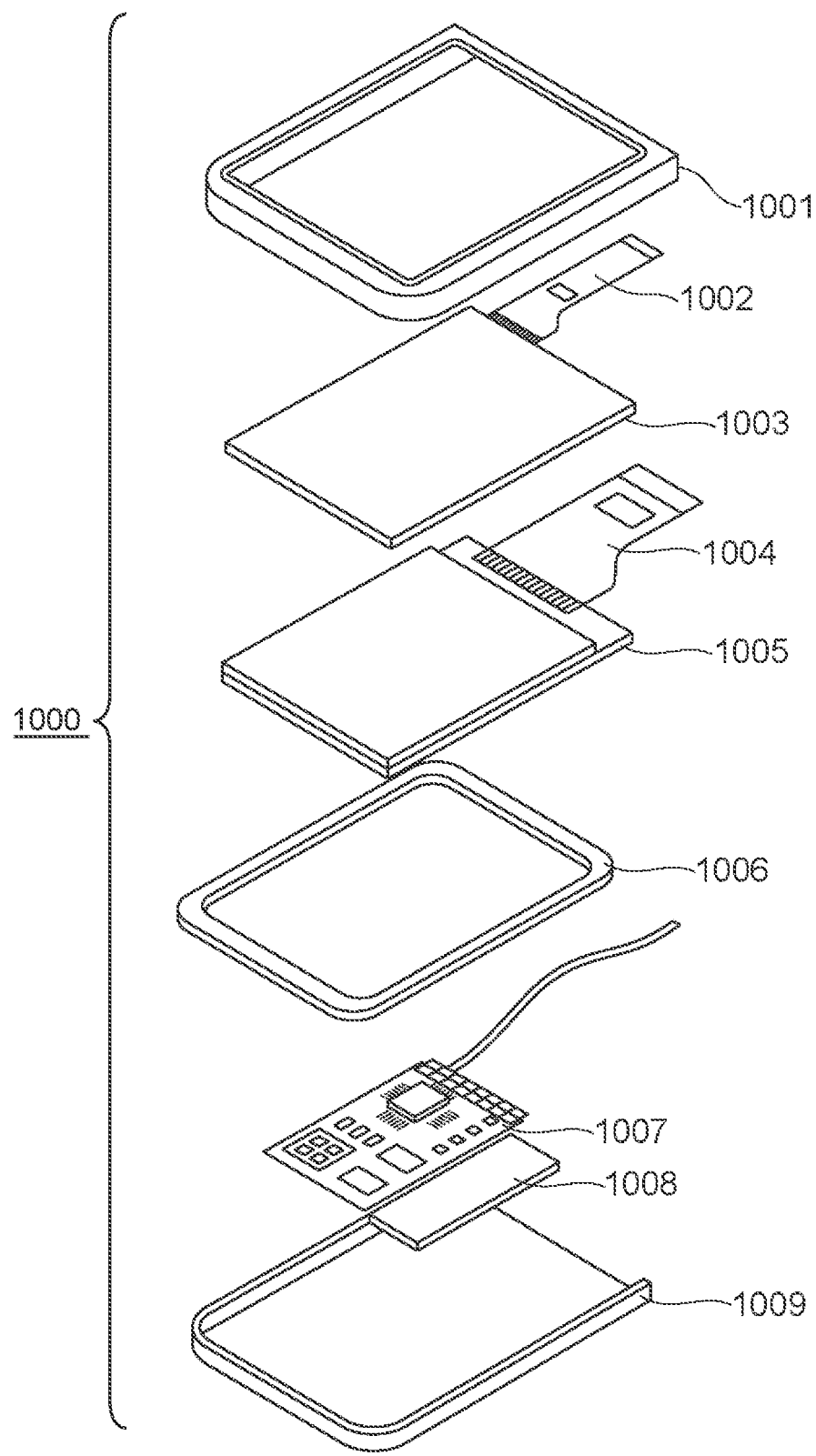
FIG. 9 is a view showing an example of a display apparatus using the organic device shown in FIG. 1.

Application examples in which the organic device 100 of this embodiment is applied to a display apparatus, an imaging apparatus, a portable apparatus, an illumination apparatus, and a moving object will be explained below with reference to FIGS. 9 to 14. FIG. 9 is a schematic view showing an example of the display apparatus using the organic device 100 of this embodiment. A display apparatus 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display apparatus 1000 is not a portable apparatus. Even if the display apparatus 1000 is a portable apparatus, the battery 1008 need not be installed in this position. As the display panel 1005, it is possible to use the above-described organic device 100 in which the organic function layer 211 contains an organic light-emitting material and which functions as a light-emitting device. The organic device 100 that functions as the display panel 1005 operates by being connected to the active elements such as transistors arranged on the circuit board 1007.

The display apparatus 1000 shown in FIG. 9 may also be used as a display unit of an imaging apparatus including an optical unit having a plurality of lenses, and an imaging element for receiving light having passed through the optical unit. This imaging apparatus can have a display unit for displaying information obtained by the imaging element. In addition, the display unit can be either a display unit exposed outside the imaging apparatus, or a display unit installed in the finder. The imaging apparatus may also be a digital camera or a digital video camera.

Figure 10:
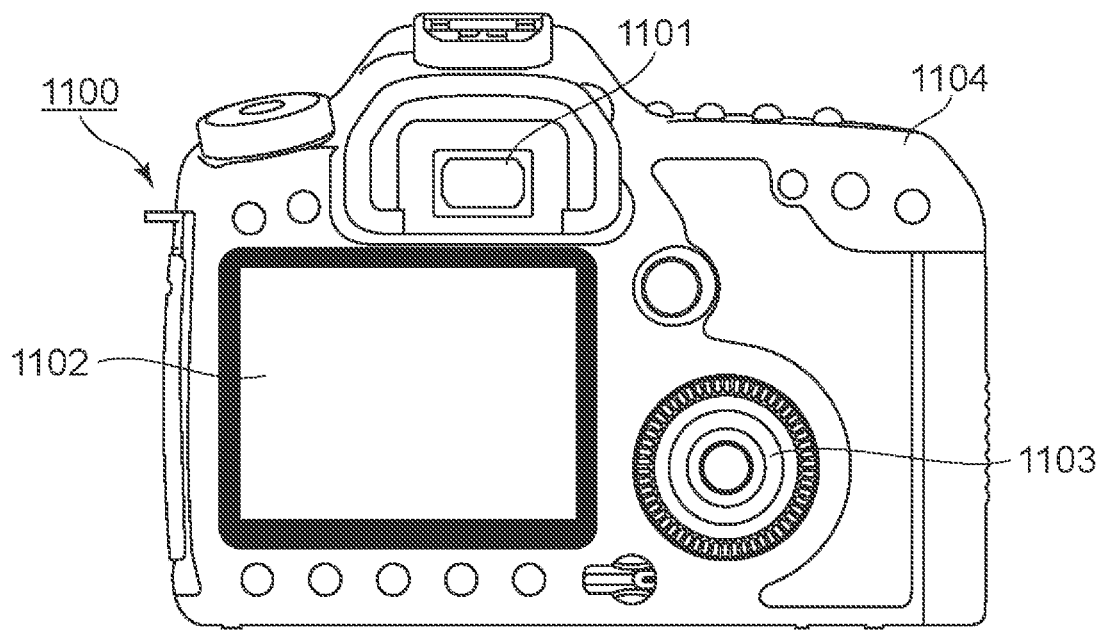
FIG. 10 is a view showing an example of an imaging apparatus using the organic device shown in FIG. 1.

FIG. 10 is a schematic view showing an example of the imaging apparatus using the organic device 100 of this embodiment. An imaging apparatus 1100 can include a view finder 1101, a back display 1102, an operation unit 1103, and a housing 1104. As the view finder 1101 as a display unit, it is possible to use the above-described organic device 100 in which the organic function layer 211 contains an organic light-emitting material and which functions as a light-emitting device. In this case, the organic device 100 can display not only an image to be captured but also environment information, imaging instructions, and the like. Examples of the environment information are the intensity and direction of external light, the moving velocity of an object, and the possibility that an object is covered with an obstacle.

The timing suitable for imaging is often a very short time, so the information is preferably displayed as soon as possible. Accordingly, the above-described organic device 100 in which the organic function layer 211 contains an organic light-emitting material can be used as the view finder 1101. This is so because an organic light-emitting material has a high response speed. The organic device 100 using an organic light-emitting material is more suitable for these apparatuses required to have a high display speed, than a liquid crystal display device.

The imaging apparatus 1100 includes an optical unit (not shown). This optical unit has a plurality of lenses, and forms an image of light having passed through the optical unit on an imaging element (not shown) that is accommodated in the housing 1104 and receives the light. The focal points of the plurality of lenses can be adjusted by adjusting the relative positions. This operation can also automatically be performed.

The organic device 100 that functions as a light-emitting device can also include a color filter that transmits red light, green light, and blue light. In this color filter, red, green, and blue can be arranged in the form of a delta array.

The above-described organic device 100 that contains an organic light-emitting material and functions as a light-emitting device can also be used as a display unit of a portable terminal. In this case, the organic device 100 can have both a display function and an operation function. Examples of the portable terminal are a portable phone such as a smartphone, a tablet, and a head mounted display.

Figure 11:
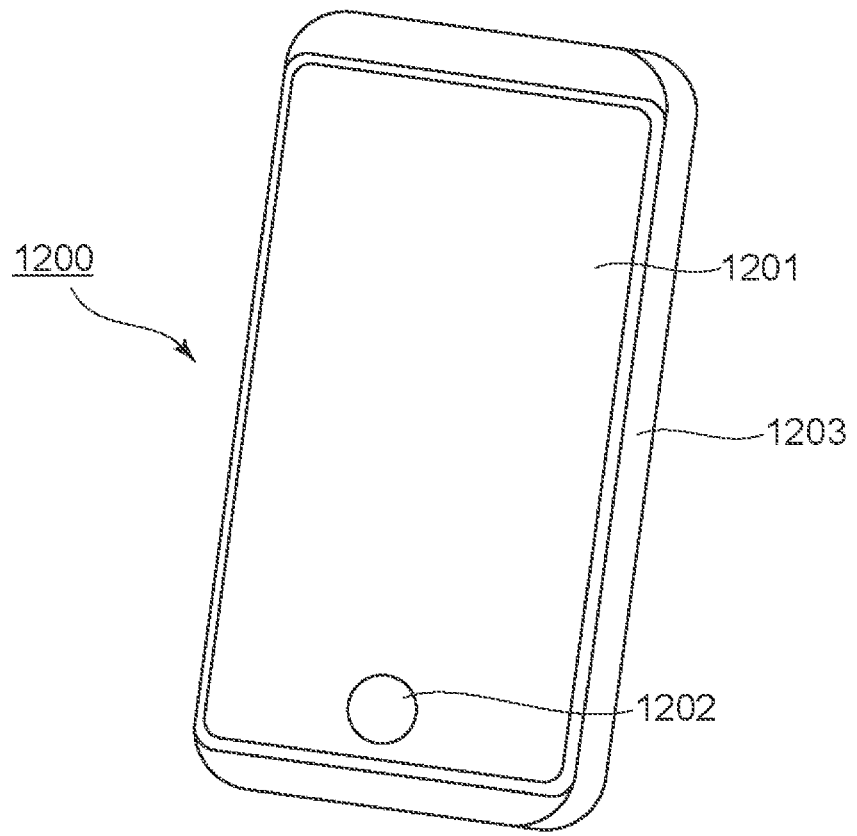
FIG. 11 is a view showing an example of a portable apparatus using the organic device shown in FIG. 1.

FIG. 11 is a schematic view showing an example of the portable apparatus using the organic device 100 of this embodiment. A portable apparatus 1200 includes a display unit 1201, an operation unit 1202, and a housing 1203. The housing 1203 can accommodate a circuit, a printed board having this circuit, a battery, and a communication unit. The operation unit 1202 can be either a button or a touch-panel-type reaction unit. The operation unit 1202 can also be a biometric authentication unit that performs unlocking or the like by authenticating the fingerprint. A portable apparatus including a communication unit can also be regarded as a communication apparatus. As the display unit 1201, it is possible to use the above-described organic device 100 in which the organic function layer 211 contains an organic light-emitting material and which functions as a light-emitting device.

Figure 12A:
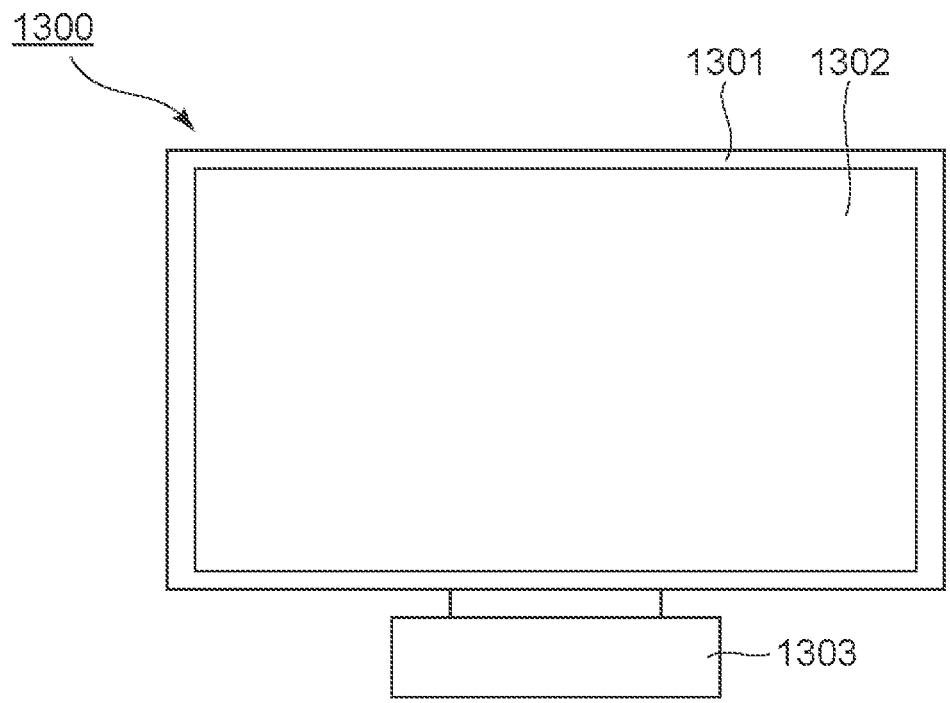
FIGS. 12A and 12B are views showing examples of a display apparatus using the organic device shown in FIG. 1.
Figure 12B:
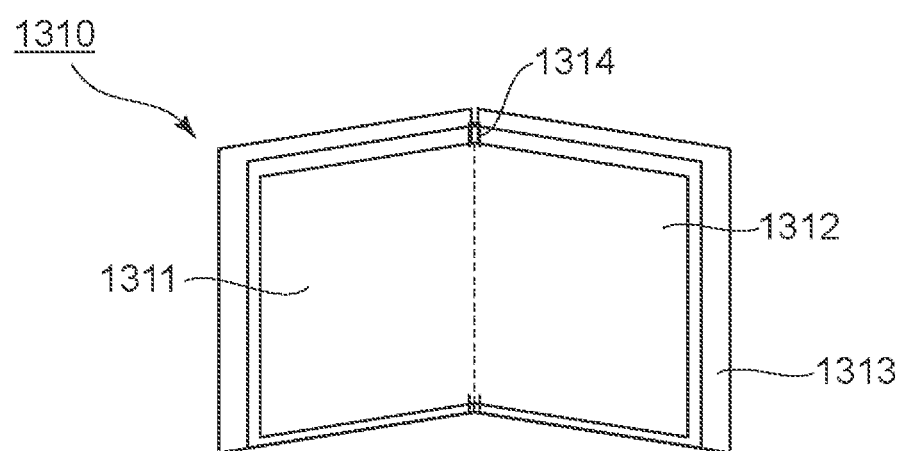

FIGS. 12A and 12B are schematic views showing examples of the display apparatus using the organic device 100 of this embodiment. FIG. 12A shows a display apparatus such as a television monitor or a PC monitor. A display apparatus 1300 includes a frame 1301 and a display unit 1302. As the display unit 1302, it is possible to use the above-described organic device 100 in which the organic function layer 211 contains an organic light-emitting material and which functions as a light-emitting device. The display apparatus 1300 may also include a base 1303 that supports the frame 1301 and the display unit 1302. The base 1303 is not limited to the form shown in FIG. 12A. For example, the lower side of the frame 1301 may also function as the base 1303. In addition, the frame 1301 and the display unit 1302 can be bent. The radius of curvature in this case can be not less than 5,000 mm and not more than 6,000 mm.

FIG. 12B is a schematic view showing another example of the display apparatus using the organic device 100 of this embodiment. A display apparatus 1310 shown in FIG. 12B can be folded, that is, the display apparatus 1310 is a so-called foldable display apparatus. The display apparatus 1310 includes a first display unit 1311, a second display unit 1312, a housing 1313, and a bending point 1314. As the first display unit 1311 and the second display unit 1312, it is possible to use the above-described organic device 100 in which the organic function layer 211 contains an organic light-emitting material and which functions as a light-emitting device. The first display unit 1311 and the second display unit 1312 can also be one seamless display device. The first display unit 1311 and the second display unit 1312 can be divided from the bending point. The first display unit 1311 and the second display unit 1312 can display different images, and can also display one image together.

Figure 13:
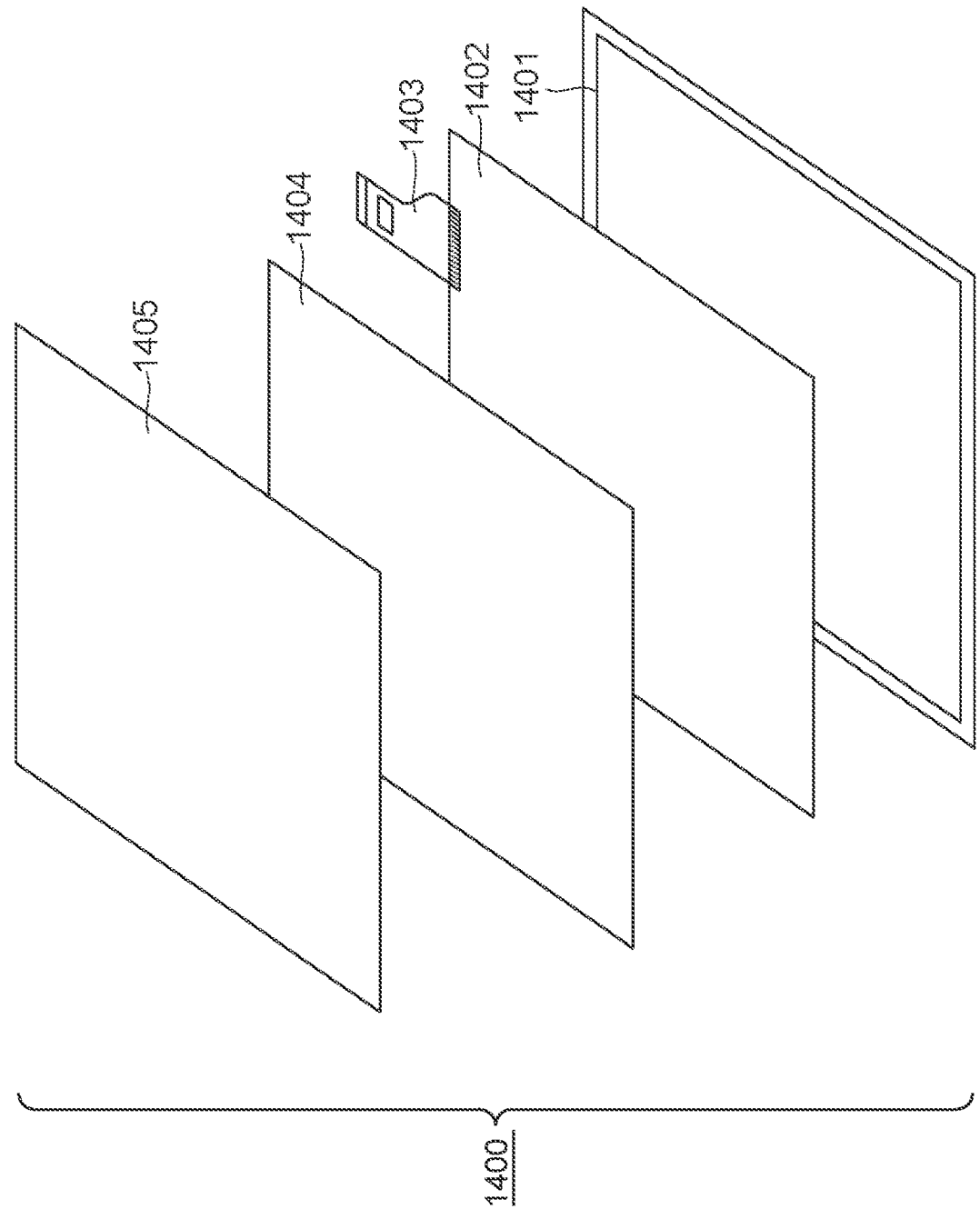
FIG. 13 is a view showing an example of an illumination apparatus using the organic device shown in FIG. 1.

FIG. 13 is a schematic view showing an example of the illumination apparatus using the organic device 100 of this embodiment. An illumination apparatus 1400 can include a housing 1401, a light source 1402, a circuit board 1403, an optical film 1404, and a light-diffusing unit 1405. As the light source 1402, it is possible to use the above-described organic device 100 in which the organic function layer 211 contains an organic light-emitting material and which functions as a light-emitting device. The optical film 1404 can be a filter that improves the color rendering of the light source. When performing lighting-up or the like, the light-diffusing unit 1405 can throw the light of the light source over a broad range by effectively diffusing the light. The illumination apparatus 1400 can also include a cover on the outermost portion. The illumination apparatus 1400 can include both the optical film 1404 and the light-diffusing unit 1405, and can also include only one of them.

The illumination apparatus 1400 is an apparatus for illuminating the room or the like. The illumination apparatus 1400 can emit white light, natural white light, or light of any color from blue to red. The illumination apparatus 1400 can also include a light control circuit for controlling these light components. The illumination apparatus 1400 can also include a power supply circuit to be connected to the organic device 100 that functions as the light source 1402. This power supply circuit is a circuit for converting an AC voltage into a DC voltage. "White" has a color temperature of 4,200 K, and "natural white" has a color temperature of 5,000 K. The illumination apparatus 1400 may also have a color filter. In addition, the illumination apparatus 1400 can have a heat radiation unit. The heat radiation unit radiates the internal heat of the apparatus to the outside of the apparatus, and examples are a metal having a high specific heat and liquid silicon.

FIG. 14 is a schematic view of an automobile including a taillight as an example of a vehicle lighting appliance using the organic device 100 of this embodiment. An automobile 1500 has a taillight 1501, and the taillight 1501 is turned on when performing a braking operation or the like. An automobile is an example of a moving object, and the moving object can also be a ship or a drone. This moving object can include a main body and a lighting appliance installed in the main body. The lighting appliance may also be an apparatus that notifies the current position of the main body.

As the taillight 1501, it is possible to use the above-described organic device 100 in which the organic function layer 211 contains an organic light-emitting material and which functions as a light-emitting device. The taillight 1501 can include a protective member for protecting the organic device 100 that functions as the taillight 1501. This protective member can be made of any transparent material having strength that is high to some extent, and an example is polycarbonate. The protective member can also be formed by mixing a furan dicarboxylic acid derivative, an acrylonitrile derivative, or the like in polycarbonate.

The automobile 1500 can also include a main body 1503, and a window 1502 attached to the main body 1503. This window can be a window for checking the front and rear of the automobile, and can also be a transparent display. As this transparent display, it is possible to use the above-described organic device 100 in which the organic function layer 211 contains an organic light-emitting material and which functions as a light-emitting device. In this case, the constituent members such as the electrodes of the organic device 100 are made of transparent materials.

Examples and comparative examples of the organic device 100 of this embodiment will be explained below.

First Example

The organic device 100 shown in FIGS. 4A and 4B was manufactured. In this example, the organic function layer 211 contains an organic light-emitting material. Accordingly, the organic device 100 functions as a light-emitting device.

First, a silicon substrate was prepared as the substrate 201. After electronic circuits (not shown) and pad electrodes 30 were formed on the substrate 201, an insulating layer 202 was formed on the surface of the substrate 201 on which the electronic circuits (not shown) and the pad electrodes 30 using an aluminum alloy were arranged. In this example, a 1-μm thick silicon oxide layer was formed as the insulating layer 202. Then, a mask pattern having openings above the pad electrodes 30 was used to etch the insulating layer 202 below the openings of the mask pattern, thereby performing an etching step of exposing the pad electrodes 30. First, a mask pattern having desired openings was formed by resist coating, exposure, and development, and the insulating layer 202 was etched by plasma etching using a reactive gas in a dry etching apparatus. After the insulating layer 202 was etched, the mask pattern was removed by a stripping solution.

Then, in the pixel region 10, a pixel formation step of forming a plurality of pixels on the insulating layer 202 was performed. First, lower electrodes 210 were formed by sequentially stacking an aluminum alloy and indium tin oxide on the insulating layer 202 from the upper surface side of the substrate 201. As described previously, the lower electrodes 210 were connected to the electronic circuits arranged on that side of the insulating layer 202, which faced the substrate 201, by plug electrodes formed in the insulating layer 202.

After the lower electrodes 210 were formed, an organic function layer 211 containing an organic light-emitting material was formed on the lower electrodes 210 in the pixel region 10. As a method of forming the organic function layer 211, vacuum vapor deposition using a vapor deposition mask having a desired opening pattern can be used.

After the organic function layer 211 was formed, a 0.5-nm thick electron injection layer (not shown) using lithium fluoride (LiF) was formed on the organic function layer 211, and a 10-nm thick upper electrode 212 was formed on the electron injection layer by using a silver-magnesium mixed film (volume ratio=1:1). As a method of forming the upper electrode 212, vacuum vapor deposition using a vapor deposition mask having a desired opening pattern can be used.

After the pixel formation step of forming a plurality of pixels on the insulating layer 202, a sealing layer 300 and a resin layer 400 were stacked in that order. First, the sealing layer 300 was so formed as to cover the whole substrate 201. That is, a 1,500-nm thick silicon nitride layer was formed as a water inhibiting layer 301 on the entire surface of the substrate 201 by using the CVD method. Then, a 100-nm thick aluminum oxide layer was formed as a defect preventing layer 302 on the entire surface of the substrate 201 by using the ALD method, so as to cover the water inhibiting layer 301. In addition, a 500-nm thick silicon nitride layer was formed as a water inhibiting layer 303 on the entire surface of the substrate 201 by using the CVD method, so as to cover the defect preventing layer 302. Then, the entire surface of the substrate 201 was coated with a 400-nm thick resin layer as the resin layer 400 by using the spin coating method, so as to cover the water inhibiting layer 303, and the resin layer 400 was calcined at a high temperature. As described earlier, the resin layer 400 also functions as a planarizing layer below the color filter 500.

Subsequently, a color filter 500 was formed in the pixel region 10. A red filter 501, a green filter 502, and a blue filter 503 were formed by repeating material coating, exposure, and development for the color filter of each color. After the color filter 500 was formed, a planarizing layer 402 was formed by coating a 400-nm thick resin layer by the spin coating method, and calcining the resin layer at a high temperature.

After the planarizing layer 402 was formed, the planarizing layer 402, the resin layer 400, and the sealing layer 300 on the pad electrodes 30 were etched by dry etching, thereby exposing the pad electrodes 30. By etching the planarizing layer 402, the resin layer 400, and the sealing layer 300 in one etching step, it was possible to simplify the manufacturing process of the organic device 100 and reduce the manufacturing cost. More specifically, a mask pattern having an opening inside the end of the opening formed in the insulating layer 202 by the etching step of the above-described insulating layer 202, in orthographic projection to the upper surface of the substrate 201, was formed by using resist coating, exposure, and development. Then, the planarizing layer 402, the resin layer 400, and the sealing layer 300 were etched by plasma etching using a reactive gas in a dry etching apparatus. After the planarizing layer 402, the resin layer 400, and the sealing layer 300 were etched, the mask pattern was removed by a stripping solution.

By the above steps, as shown in FIG. 4B, the water inhibiting layer 301 was so formed as to cover the end a of the opening of the insulating layer 202. Also, the defect preventing layer 302 was so formed as to cover the step S1 of the water inhibiting layer 301. In addition, the resin layer 400 was so formed as to cover the step S2 of the water inhibiting layer 303. The openings of the mask pattern and the conditions of dry etching in each step were adjusted such that the defect preventing layer 302 covering the step S1 of the water inhibiting layer 301 was not removed by side etching or the like. Likewise, the openings of the mask pattern and the conditions of dry etching in each step were adjusted such that the resin layer 400 covering the step S2 of the water inhibiting layer 303 was not removed.

By the above steps, in orthographic projection to the upper surface of the substrate 201, the end e of the opening of the resin layer 400 was arranged closer to the center p of the exposed pad electrode 30 than the end a of the opening of the insulating layer 202. Also, in orthographic projection to the upper surface of the substrate 201, the end d of the opening of the water inhibiting layer 303 was arranged in the same position as the end e of the opening of the resin layer 400, or arranged closer to the center p of the exposed pad electrode 30 than the end e of the opening of the resin layer 400. In addition, in orthographic projection to the upper surface of the substrate 201, the end c of the opening of the defect preventing layer 302 was arranged in the same position as the end d of the opening of the water inhibiting layer 303, or arranged closer to the center p of the exposed pad electrode 30 than the end d of the opening of the water inhibiting layer 303. Furthermore, in orthographic projection to the upper surface of the substrate 201, the end b of the opening of the water inhibiting layer 301 was arranged in the same position as the end c of the opening of the defect preventing layer 302, or arranged closer to the center p of the exposed pad electrode 30 than the end c of the opening of the defect preventing layer 302. This positional relationship between the ends a to e of the openings was obtained because, when the sealing layer 300 and the resin layer 400 were dry-etched by using the same mask pattern, side etching etched upper layers more inward than lower layers.

The organic device 100 of this example was able to suppress an invasion of water to the organic function layer 211. More specifically, the organic device 100 of the present invention was a light-emitting device as described previously, so the luminous efficiency (cd/A) when a desired voltage was applied was measured. In addition, a humidity resistance test was conducted by a pressure cooker capable of conducting the test in a high-density water vapor atmosphere. After the organic device 100 was left to stand in a high-density water vapor atmosphere at 100° C. or more for 1,000 hrs or more, the luminous efficiency (cd/A) of the organic device 100 was measured. Consequently, no significant decrease in luminous efficiency was confirmed.

First Comparative Example

Figure 5A:
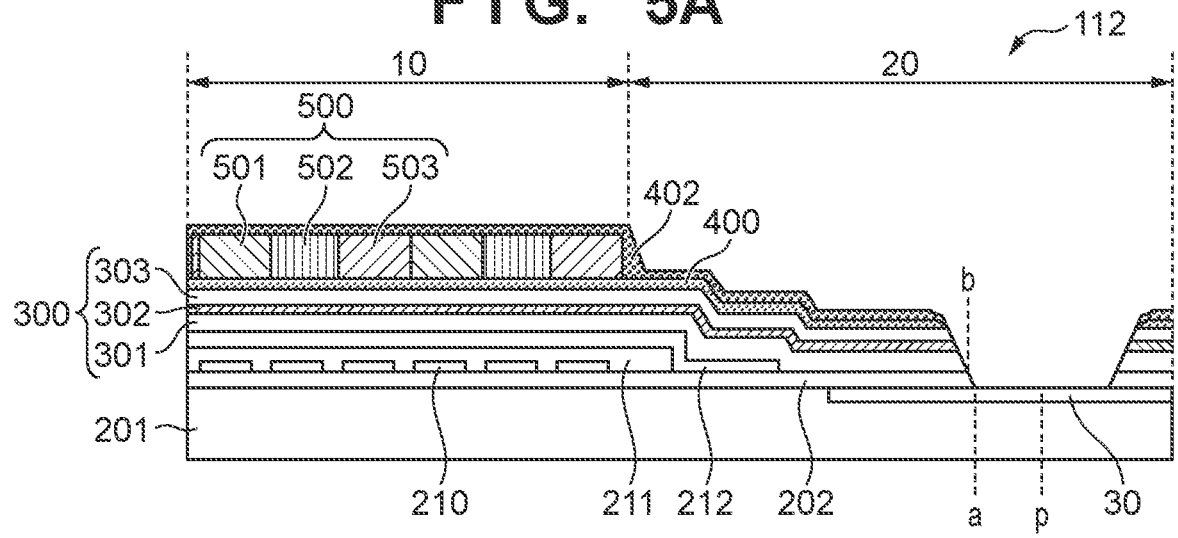
FIGS. 5A to 5C are sectional views of comparative examples of the organic device shown in FIG. 1.

An organic device 112 shown in FIG. 5A was manufactured as an organic device of a comparative example. In the above-described first example, the etching step of exposing the pad electrodes 30 was performed twice. More specifically, after etching for exposing the pad electrodes 30 of the insulating layer 202 was performed, the sealing layer 300 and the resin layer 400 were formed, and etching for exposing the pad electrodes 30 of the sealing layer 300 and the resin layer 400 was performed. On the other hand, in this comparative example, all of the insulating layer 202, the sealing layer 300, and the resin layer 400 (and the planarizing layer 402) were etched by dry etching by using the same mask pattern. As a consequence, the end of the opening of the insulating layer 202 was not covered with the water inhibiting layer 301 but exposed. The organic device 112 was manufactured by using the same steps as in the first example described above except the above step.

A humidity resistance test of the organic device 112 of this comparative example was conducted in a pressure cooker capable of conducting the test in a high-density water vapor atmosphere. After the organic device 112 was left to stand in a high-density water vapor atmosphere at 100° C. or more for 1,000 hrs or more, the luminous efficiency (cd/A) of the organic device 112 was measured. Consequently, the luminous efficiency decreased by about 20%.

Second Comparative Example

Figure 5B:
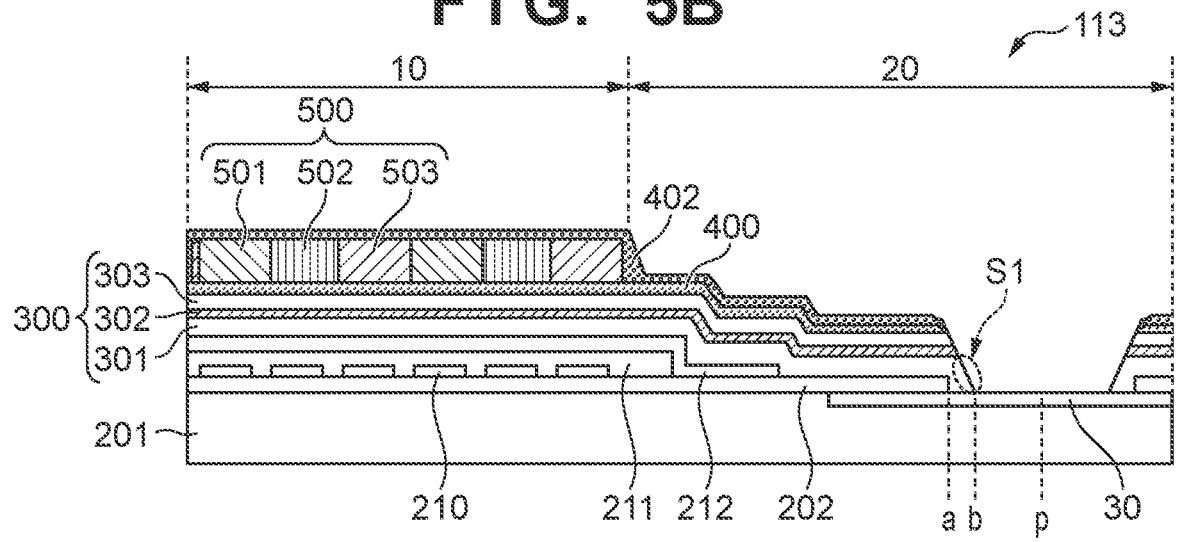

An organic device 113 was manufactured by using the same steps as in the first example described above. As shown in FIG. 5B, when etching the sealing layer 300 and the resin layer 400 of the organic device 113, side etching removed the defect preventing layer 302 covering the step S1 of the water inhibiting layer 301. As a consequence, the side surface of the step S1 of the water inhibiting layer 301 was exposed.

A humidity resistance test of the organic device 113 of this comparative example was conducted in a pressure cooker capable of conducting the test in a high-density water vapor atmosphere. After the organic device 113 was left to stand in a high-density water vapor atmosphere at 100° C. or more for 1,000 hrs or more, the luminous efficiency (cd/A) of the organic device 113 was measured. Consequently, the luminous efficiency decreased by about 12%.

Third Comparative Example

Figure 5C:
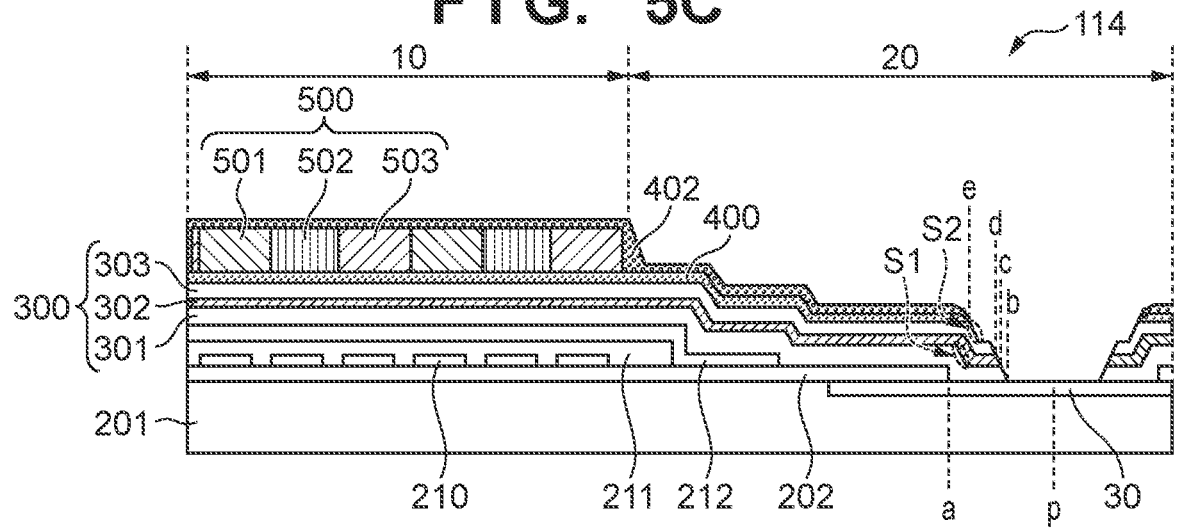

An organic device 114 was manufactured by using the same steps as in the first example described above. As shown in FIG. 5C, when etching the sealing layer 300 and the resin layer 400 of the organic device 114, side etching removed the resin layer 400 (and the planarizing layer 402) covering the step S2 of the water inhibiting layer 303. As a consequence, the side surface and bottom portion of the step S2 of the water inhibiting layer 303 were exposed.

A humidity resistance test of the organic device 114 of this comparative example was conducted in a pressure cooker capable of conducting the test in a high-density water vapor atmosphere. After the organic device 114 was left to stand in a high-density water vapor atmosphere at 100° C. or more for 1,000 hrs or more, the luminous efficiency (cd/A) of the organic device 114 was measured. Consequently, the luminous efficiency decreased by about 5%.

Second Example

Figure 6A:
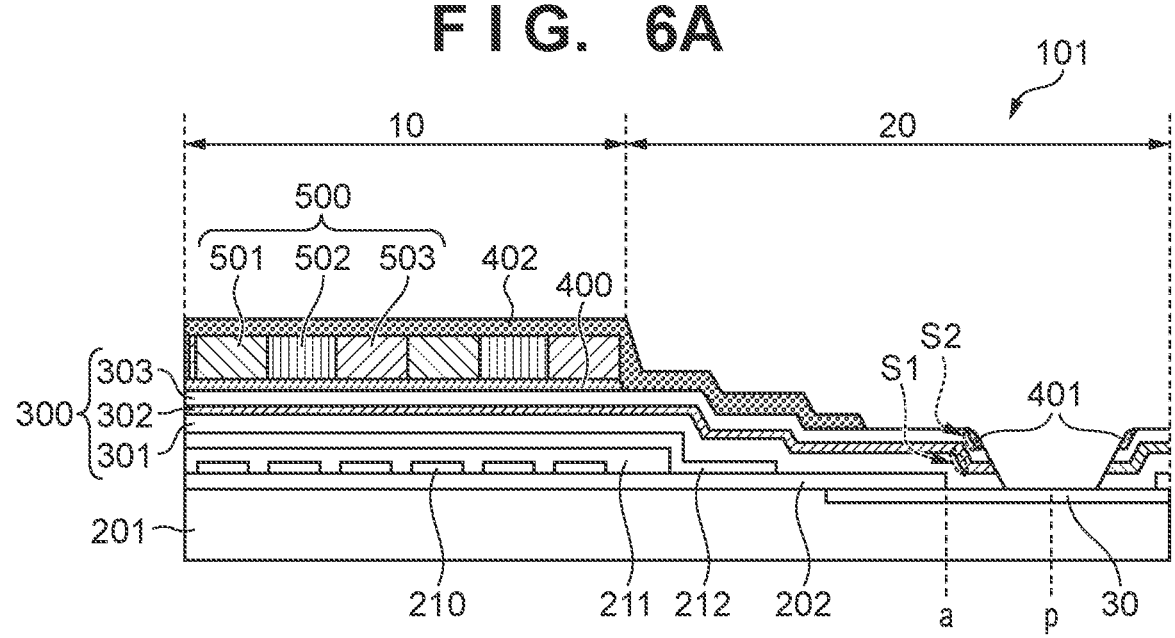
FIGS. 6A and 6B are a sectional view of the organic device shown in FIG. 1, and a sectional view of a pad electrode and its vicinity.
Figure 6B:
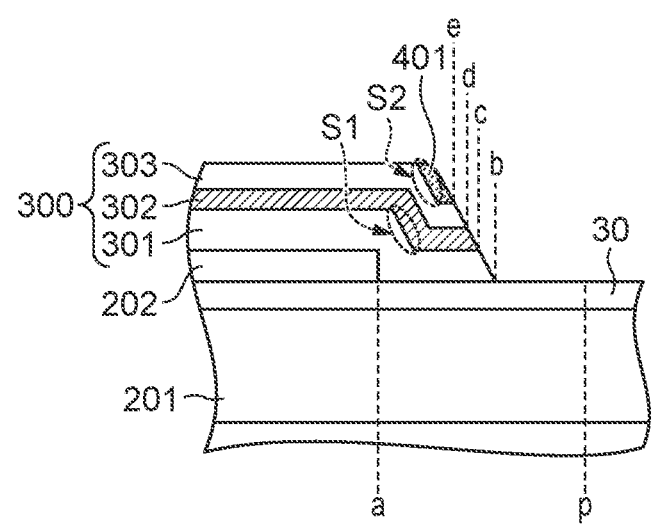

An organic device 101 shown in FIGS. 6A and 6B was manufactured. In this example, the organic function layer 211 contains an organic photoelectric conversion material. Accordingly, the organic device 101 functions as an imaging device.

First, a silicon substrate was prepared as the substrate 201. After electronic circuits (not shown) and pad electrodes 30 were formed on the substrate 201, an insulating layer 202 was formed on the surface of the substrate 201 on which the electronic circuits (not shown) and the pad electrodes 30 using an aluminum alloy were arranged. In this example, a 1.5-μm thick silicon oxide layer was formed as the insulating layer 202. Then, a mask pattern having openings above the pad electrodes 30 was used to etch the insulating layer 202 below the openings of the mask pattern, thereby performing an etching step of exposing the pad electrodes 30. First, a mask pattern having desired openings was formed by resist coating, exposure, and development, and the insulating layer 202 was etched by plasma etching using a reactive gas in a dry etching apparatus. After the insulating layer 202 was etched, the mask pattern was removed by a stripping solution.

Then, in the pixel region 10, a pixel formation step of forming a plurality of pixels on the insulating layer 202 was performed. First, lower electrodes 210 using titanium nitride were formed on the insulating layer 202. As described previously, the lower electrodes 210 were connected to the electronic circuits arranged on that side of the insulating layer 202, which faced the substrate 201, by plug electrodes formed in the insulating layer 202.

After the lower electrodes 210 were formed, an organic function layer 211 containing an organic photoelectric conversion material was formed on the lower electrodes 210 in the pixel region 10. As a method of forming the organic function layer 211, vacuum vapor deposition using a vapor deposition mask having a desired opening pattern can be used.

After the organic function layer 211 was formed, a 30-nm thick upper electrode 212 using indium zinc oxide was formed. As a method of forming the upper electrode 212, a sputtering method using a deposition mask having a desired opening pattern can be used.

After a pixel formation step of forming a plurality of pixels on the insulating layer 202, a sealing layer 300 and a resin layer 400 were stacked in that order. First, the sealing layer 300 was so formed as to cover the whole substrate 201. That is, a 2,000-nm thick silicon oxynitride layer was formed as a water inhibiting layer 301 on the entire surface of the substrate 201 by using the CVD method. Then, a 50-nm thick aluminum oxide layer was formed as a defect preventing layer 302 on the entire surface of the substrate 201 by using the ALD method, so as to cover the water inhibiting layer 301. In addition, a 500-nm thick silicon oxynitride layer was formed as a water inhibiting layer 303 on the entire surface of the substrate 201 by using the CVD method, so as to cover the defect preventing layer 302. Then, the entire surface of the substrate 201 was coated with a 600-nm thick resin layer as the resin layer 400 by using the spin coating method, so as to cover the water inhibiting layer 303, and the resin layer 400 was calcined at a high temperature. As described earlier, the resin layer 400 also functions as a planarizing layer below the color filter 500.

Subsequently, a color filter 500 was formed in the pixel region 10. A red filter 501, a green filter 502, and a blue filter 503 were formed by repeating material coating, exposure, and development for the color filter of each color.

After the color filter 500 was formed, the resin layer 400 and the sealing layer 300 on the pad electrodes 30 were etched by dry etching, thereby exposing the pad electrodes 30. By etching the resin layer 400 and the sealing layer 300 in one etching step, it was possible to simplify the manufacturing process of the organic device 101 and reduce the manufacturing cost. More specifically, a mask pattern having an opening inside the end of the opening formed in the insulating layer 202 by the above-described insulating layer 202 etching step, in orthographic projection to the upper surface of the substrate 201, was formed by using resist coating, exposure, and development. Then, the resin layer 400 and the sealing layer 300 were etched by plasma etching using a reactive gas in a dry etching apparatus. After the resin layer 400 and the sealing layer 300 were etched, the mask pattern was removed by a stripping solution.

By the above steps, as shown in FIG. 6B, the water inhibiting layer 301 was so formed as to cover the end a of the opening of the insulating layer 202. Also, the defect preventing layer 302 was so formed as to cover the step S1 of the water inhibiting layer 301. In addition, the resin layer 400 was so formed as to cover the step S2 of the water inhibiting layer 303. In this example, the resin layer 400 was formed on the pixel region 10 and the step S2 of the water inhibiting layer 303. This is so because dry etching for etching the sealing layer 300 and the resin layer 400 removed the resin layer 400 in the corresponding portion together with the mask pattern. When forming the water inhibiting layers 301 and 303 using silicon nitride or silicon oxynitride by using the CVD method or the like, a defect such as the formation of an air gap having a low film density and lacking denseness easily occurs on the side surface or in the intersection of the side surface and the bottom portion of the steps S1 and S2. As shown in FIG. 6B, therefore, the resin layer 400 covers at least the step S2 of the water inhibiting layer 303 in the peripheral region 20, and this makes it possible to suppress an invasion of water to the defect preventing layer 302 via the step S2 of the water inhibiting layer 303. Since the resin layer 400 covers the side surface of the step S2 of the water inhibiting layer 303, it is possible to simultaneously cover the intersection of the side surface and the bottom portion of the step S2 of the water inhibiting layer 303. Like the organic device 100 described above, the reliability of the organic device 101 can improve in the structure shown in FIG. 6B as well. Also, if the organic function layer 211 of the organic device 101 contains an organic light-emitting material, the organic device 101 can function as a light-emitting device. In this case, the organic device 101 is applicable to each of the display apparatuses 1000, 1300, and 1310, the imaging apparatus 1100, the portable apparatus 1200, the illumination apparatus 1400, and the automobile 1500 shown in FIGS. 9 to 14, like the organic device 100.

After the pad electrodes 30 were exposed, a 600-nm thick resin layer was applied as a planarizing layer 402 by the spin coating method, and patterned into a desired shape. As shown in FIG. 6B, the peripheral region 20 can include a portion where the water inhibiting layer 303 was exposed. Then, a microlens (not shown) for increasing the light collection efficiency was formed on the planarizing layer 402. The planarizing layer 402 must have a high planarity in order to accurately form the shape of the microlens.

The organic device 101 of this example was able to suppress an invasion of water to the organic function layer 211. More specifically, the organic device 101 of the present invention was an imaging device as described above, so the sensitivity ($e^-/lx \cdot s \cdot \mu m^2$) per unit area when a desired voltage was applied was measured. In addition, a humidity resistance test was conducted by a pressure cooker capable of conducting the test in a high-density water vapor atmosphere. After the organic device 101 was left to stand in a high-density water vapor atmosphere at 100° C. or more for 1,000 hrs or more, the sensitivity ($e^-/lx \cdot s \cdot \mu m^2$) was measured. Consequently, no significant decrease in sensitivity was confirmed.

Third Example

An organic device 118 shown in FIG. 8 was manufactured. In this example, the organic function layer 211 contains an organic photoelectric conversion material. Accordingly, the organic device 118 functions as an imaging device.

First, a silicon substrate was prepared as the substrate 201. After electronic circuits (not shown) and pad electrodes 30 were formed on the substrate 201, an insulating layer 202 was formed on the surface of the substrate 201 on which the electronic circuits (not shown) and the pad electrodes 30 using an aluminum alloy were arranged. In this example, a 1.5-μm thick silicon oxide layer was formed as the insulating layer 202.

Then, in the pixel region 10, a pixel formation step of forming a plurality of pixels on the insulating layer 202 was performed. First, lower electrodes 210 using a single-layered or multilayered alloy containing titanium or aluminum were formed on the insulating layer 202. As described previously, the lower electrodes 210 were connected to the electronic circuits formed on that side of the insulating layer 202, which faced the substrate 201, by plug electrodes formed in the insulating layer 202.

Then, an insulating layer 801 for reducing a current leak between electrodes was formed on the surface of the substrate 201 on which the lower electrodes 210 and the insulating layer 202 were formed. Subsequently, a mask pattern having openings above the pad electrodes 30 was used to etch the insulating layer 202 and the insulating layer 801 below the openings of the mask pattern, thereby performing an etching step of exposing the pad electrodes 30. First, a mask pattern having desired openings was formed by using resist coating, exposure, and development, and the insulating layer 202 was etched by plasma etching using a reactive gas in a dry etching apparatus. After the insulating layer 202 was etched, the mask pattern was removed by a stripping solution.

Then, a mask pattern having openings above the lower electrodes 210 was used to etch the insulating layer 801 below the openings of the mask pattern, thereby performing an etching step of exposing the lower electrodes 210. First, a mask pattern having desired openings was formed by using resist coating, exposure, and development, and the insulating layer 801 was etched by plasma etching using a reactive gas in a dry etching apparatus, thereby forming insulating layers 801 covering the side surfaces of the lower electrodes 210. After the etching for forming the insulating layers 801, the mask pattern was removed by a stripping solution. To suppress the formation of a modified layer by the stripping solution on the surfaces of the lower electrodes 210, it is possible to etch the insulating layer 202 and the insulating layer 801 on the pad electrodes 30, and then etch the insulating layer 801 on the lower electrodes 210, as disclosed in this example.

After the insulating layer 801 on the lower electrodes 210 was etched, an organic function layer 211 containing an organic photoelectric conversion material was formed on the lower electrodes 210 in the pixel region 10. As a method of forming the organic function layer 211, vacuum vapor deposition using a vapor deposition mask having a desired opening pattern can be used. By this step, a plurality of lower electrodes 210 are arranged between the insulating layer 202 and the organic function layer 211.

After the organic function layer 211 was formed, a 30-nm thick upper electrode 212 using silver and magnesium was formed. As a method of forming the upper electrode 212, a sputtering method using a deposition mask having a desired opening pattern can be used.

After a pixel formation step of forming a plurality of pixels on the insulating layer 202, a sealing layer 300 and a resin layer 400 were stacked in that order. First, the sealing layer 300 was so formed as to cover the whole substrate 201. That is, a 2,000-nm thick silicon oxynitride layer was formed as a water inhibiting layer 301 on the entire surface of the substrate 201 by using the CVD method. Then, a 50-nm thick aluminum oxide layer was formed as a defect preventing layer 302 on the entire surface of the substrate 201 by using the ALD method, so as to cover the water inhibiting layer 301. In addition, a 500-nm thick silicon oxynitride layer was formed as a water inhibiting layer 303 on the entire surface of the substrate 201 by using the CVD method, so as to cover the defect preventing layer 302. Then, the entire surface of the substrate 201 was coated with a 600-nm thick resin layer as the resin layer 400 by using the spin coating method, so as to cover the water inhibiting layer 303, and the resin layer 400 was calcined at a high temperature. As described earlier, the resin layer 400 also functions as a planarizing layer below the color filter 500.

Subsequently, a color filter 500 was formed in the pixel region 10. A red filter 501, a green filter 502, and a blue filter 503 were formed by repeating material coating, exposure, and development for the color filter of each color.

After the color filter 500 was formed, the resin layer 400 and the sealing layer 300 on the pad electrodes 30 were etched by dry etching, thereby exposing the pad electrodes 30. By etching the resin layer 400 and the sealing layer 300 in one etching step, it was possible to simplify the manufacturing process of the organic device 101 and reduce the manufacturing cost. More specifically, a mask pattern having an opening inside the end of the opening formed in the insulating layer 202 by the above-described insulating layer 202 etching step, in orthographic projection to the upper surface of the substrate 201, was formed by using resist coating, exposure, and development. Then, the resin layer 400 and the sealing layer 300 were etched by plasma etching using a reactive gas in a dry etching apparatus. After the resin layer 400 and the sealing layer 300 were etched, the mask pattern was removed by a stripping solution.

By the above steps, the water inhibiting layer 301 was so formed as to cover the end a of the opening of the insulating layer 202, as shown in FIG. 8. Also, the defect preventing layer 302 was so formed as to cover the step S1 of the water inhibiting layer 301. In addition, the resin layer 400 was so formed as to cover the step S2 of the water inhibiting layer 303. The organic device 118 of this example has a structure in which the insulating layer 801 covering the side surface of each lower electrode 210 is added to the organic device 101 in order to suppress a leakage electric current between the lower electrodes 210. Therefore, the steps after the resin layer 400 is formed can be the same as those of the second example described above, so an explanation thereof will be omitted.

The organic device 118 of this example was able to suppress an invasion of water to the organic function layer 211. Also, a similar humidity resistance test as that of the organic device 101 described above was conducted, and no significant decrease in sensitivity was confirmed. That is, like the organic device 101 described above, the reliability of the organic device 118 can improve in the structure shown in FIG. 8 as well. Also, if the organic function layer 211 of the organic device 118 contains an organic light-emitting material, the organic device 118 can function as a light-emitting device. In this case, the organic device 118 is applicable to each of the display apparatuses 1000, 1300, and 1310, the imaging apparatus 1100, the portable apparatus 1200, the illumination apparatus 1400, and the automobile 1500 shown in FIGS. 9 to 14, like the organic device 100.

Fourth Comparative Example

Figure 7A:
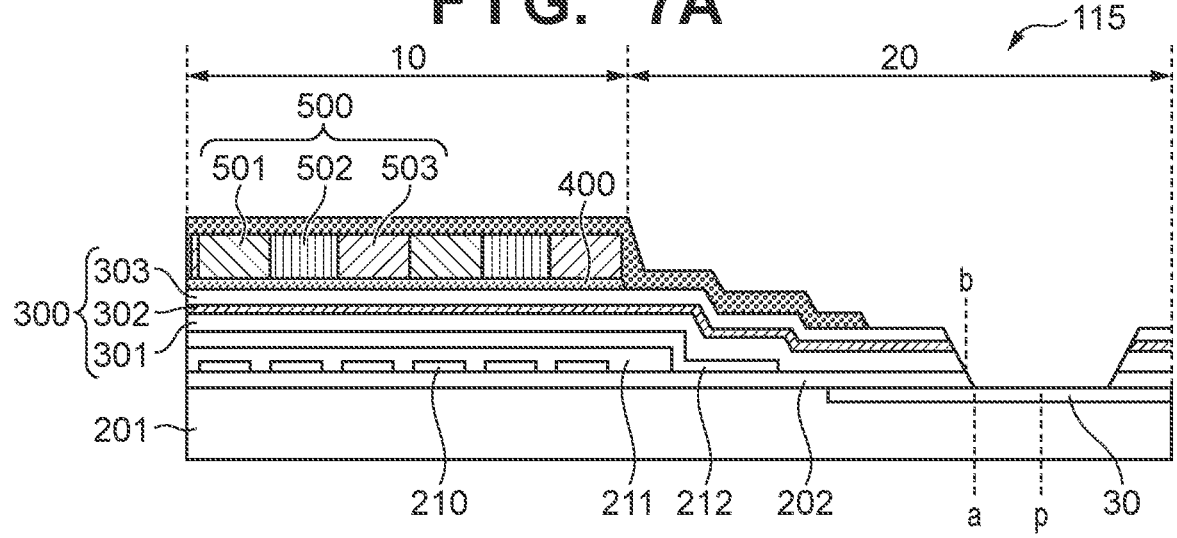
FIGS. 7A to 7C are sectional views of comparative examples of the organic device shown in FIG. 6A.

An organic device 115 shown in FIG. 7A was manufactured as an organic device of a comparative example. In the above-described second example, the etching step of exposing the pad electrodes 30 was performed twice. More specifically, after etching for exposing the pad electrodes 30 of the insulating layer 202 was performed, the sealing layer 300 and the resin layer 400 were formed, and etching for exposing the pad electrodes 30 of the sealing layer 300 and the resin layer 400 was performed. On the other hand, in this comparative example, all of the insulating layer 202, the sealing layer 300, and the resin layer 400 were etched by dry etching by using the same mask pattern. As a consequence, the end of the opening of the insulating layer 202 was not covered with the water inhibiting layer 301 but exposed. The organic device 115 was manufactured by using the same steps as in the first example described above except the above step.

A humidity resistance test of the organic device 115 of this comparative example was conducted in a pressure cooker capable of conducting the test in a high-density water vapor atmosphere. After the organic device 115 was left to stand in a high-density water vapor atmosphere at 100° C. or more for 1,000 hrs or more, the sensitivity ($e^-/lx \cdot s \cdot \mu m^2$) of the organic device 115 was measured. Consequently, the sensitivity decreased by about 22%.

Fifth Comparative Example

Figure 7B:
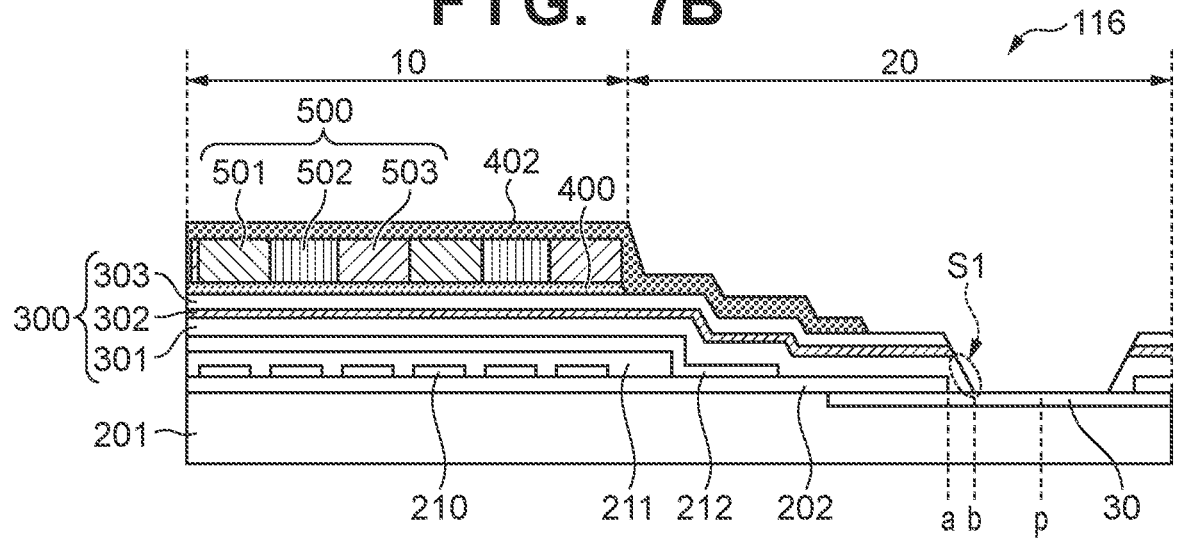

An organic device 116 was manufactured by using the same steps as in the second example described above. As shown in FIG. 7B, when etching the sealing layer 300 and the resin layer 400 of the organic device 116, side etching removed the defect preventing layer 302 covering the step S1 of the water inhibiting layer 301. As a consequence, the side surface of the step S1 of the water inhibiting layer 301 was exposed.

A humidity resistance test of the organic device 116 of this comparative example was conducted in a pressure cooker capable of conducting the test in a high-density water vapor atmosphere. After the organic device 116 was left to stand in a high-density water vapor atmosphere at 100° C. or more for 1,000 hrs or more, the sensitivity ($e^-/lx \cdot s \cdot \mu m^2$) of the organic device 116 was measured. Consequently, the sensitivity decreased by about 16%.

Sixth Comparative Example

Figure 7C:
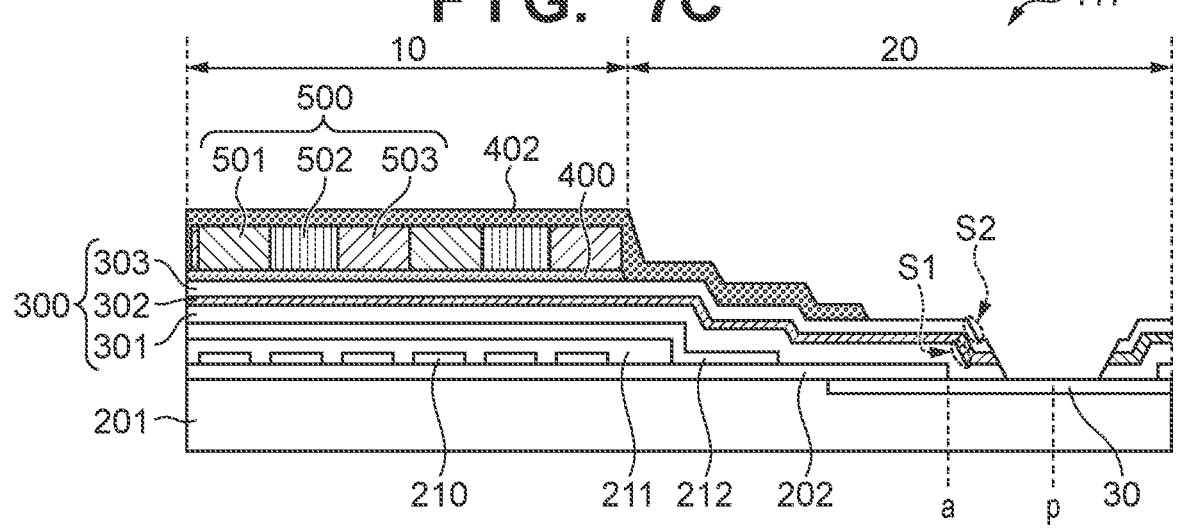

An organic device 117 was manufactured by using the same steps as in the second example described above. As shown in FIG. 7C, when etching the sealing layer 300 and the resin layer 400 of the organic device 117, side etching removed the resin layer 400 covering the step S2 of the water inhibiting layer 303. As a consequence, the side surface and bottom portion of the step S2 of the water inhibiting layer 303 were exposed.

A humidity resistance test of the organic device 117 of this comparative example was conducted in a pressure cooker capable of conducting the test in a high-density water vapor atmosphere. After the organic device 117 was left to stand in a high-density water vapor atmosphere at 100° C. or more for 1,000 hrs or more, the sensitivity ($e^-/lx \cdot s \cdot \mu m^2$) of the organic device 117 was measured. Consequently, the sensitivity decreased by about 7%.

As described above, compared to the organic devices 112 to 114 of the first to third comparative examples, the organic device 100 of the first example did not decrease the luminous efficiency. Also, compared to the organic devices 115 to 117 of the fourth to sixth comparative examples, the organic devices 101 and 118 of the second and third examples did not decrease the sensitivity. Thus, the reliability of an organic device can improve by the use of the structure disclosed in this example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An organic device including a substrate surface providing a pixel region in which a plurality of pixels are arranged and a peripheral region including a pad electrode,
the organic device comprising a first layer, an organic function layer, a second layer, a fourth layer, and a resin layer in that order from a side of the substrate surface in the pixel region,
the organic device comprising the pad electrode, the first layer, and the second layer in that order from the side of the substrate surface in the peripheral region,
the first layer and the second layer each having openings for exposing the pad electrode in the peripheral region,
wherein the second layer contains a compound comprising nitrogen and silicon,
wherein the fourth layer contains a compound comprising oxygen and aluminum, and
wherein, in an orthographic projection to the substrate surface, an end of the opening of the second layer is arranged between an end of the opening of the first layer and a center of the exposed pad electrode.

2. An organic device including a substrate surface providing a pixel region in which a plurality of pixels are arranged and a peripheral region including a pad electrode,
the organic device comprising a first layer, an organic function layer, a second layer, a forth layer, and a resin layer in that order from a side of the substrate surface in the pixel region,
the organic device comprising the pad electrode, the first layer, and the second layer in that order from the side of the substrate surface in the peripheral region, the first layer and the second layer each having openings for exposing the pad electrode in the peripheral region,
wherein the second layer has a water permeability lower than that of the first layer,
wherein the fourth layer has a defect density lower than that of the second layer, and
wherein, in an orthographic projection to the substrate surface, an end of the opening of the second layer is arranged between an end of the opening of the first layer and a center of the exposed pad electrode.

3. The device according to claim 1, wherein the forth layer extends from the pixel region to the peripheral region, and
wherein, in the orthographic projection to the substrate surface, an end of the fourth layer is arranged between the end of the opening of the first layer and the end of the opening of the second layer.

4. The device according to claim 1, wherein the second layer comprises a step that is arranged above the end of the opening of the first layer, the step being covered by the fourth layer in the peripheral region.

5. The device according to claim 1, further comprising a third layer arranged between the fourth layer and the resin layer in the pixel region.

6. The device according to claim 5, wherein the third layer has a water permeability lower than that of the first layer.

7. The device according to claim 1, wherein the first layer has a thickness of 0.5 to 5.0 μm.

8. The device according to claim 1, wherein the fourth layer comprises aluminum oxide.

9. The device according to claim 8, wherein the first layer comprises silicon oxide and the second layer comprises silicon nitride.

10. The device according to claim 6, wherein the first layer comprises silicon oxide, the second layer and the third layer each comprises silicon nitride, and the fourth layer comprises aluminum oxide.

11. The device according to claim 1, further comprising a color filter arranged above the resin layer in the pixel region.

12. The device according to claim 1, wherein the organic function layer comprises an organic light-emitting material.

13. The device according to claim 1, wherein the organic function layer comprises an organic photoelectric conversion material.

14. The device according to claim 1, further comprising a plurality of lower electrodes arranged between the first layer and the organic function layer,
wherein a side surface of each of the plurality of lower electrodes is covered with an insulating layer.

15. The device according to claim 2, wherein the water permeability of the second layer is not more than $1\times10^{-5}$ g/m$^2$·day.

16. A display apparatus comprising:
an organic device according to claim 1; and
an active element connected to the organic device.

17. An imaging apparatus comprising an optical unit including:
a plurality of lenses;
an imaging element configured to receive light having passed through the optical unit; and
a display unit configured to display an image,
wherein the display unit is configured to display an image obtained by the imaging element, and comprises the organic device according to claim 1.

18. An illumination apparatus comprising:
a light source; and
at least one of a light diffusing unit and an optical film,
wherein the light source comprises the organic device according to claim 1.

19. A moving object comprising:
a main body; and
a lighting appliance installed in the main body,
wherein the lighting appliance comprises the organic device according to claim 1.

20. The device according to claim 1, wherein a defect density of the fourth layer is lower than that of the second layer.

21. An organic device including a substrate providing a pixel region in which a plurality of pixels are arranged and a peripheral region including a pad electrode,
the organic device comprising a first layer, an organic function layer, a fourth layer, and a third layer in this order from a side of the substrate,
the first layer and the fourth layer each having openings for exposing the pad electrode in the peripheral region,
wherein the third layer contains a compound comprising nitrogen and silicon,
wherein the fourth layer contains a compound comprising oxygen and aluminum, and
wherein, in an orthographic projection to the substrate, an end of the opening of the fourth layer is arranged between an end of the opening of the first layer and a center of the exposed pad electrode.

22. The organic device according to claim 21, wherein a defect density of the fourth layer is lower than that of the third layer.

23. The organic device according to claim 21, further comprising a second layer arranged between the organic function layer and the fourth layer in the pixel region.

24. The organic device according to claim 21, wherein the third layer has a water permeability lower than that of the first layer.

25. The organic device according to claim 21, further comprising a resin layer disposed on the third layer.

26. A display apparatus comprising:
the organic device according to claim 21; and
an active element connected to the organic device.

* * * * *